United States Patent
Gao et al.

(10) Patent No.: US 10,174,406 B2
(45) Date of Patent: *Jan. 8, 2019

(54) COPPER ALLOY PLATE AND METHOD FOR PRODUCING SAME

(75) Inventors: Weilin Gao, Shizuoka (JP); Hisashi Suda, Shizuoka (JP); Hiroto Narieda, Shizuoka (JP); Akira Sugawara, Shizuoka (JP)

(73) Assignee: DOWA METALTECH Co., Ltd., Tokyo (JP)

( * ) Notice: Subject to any disclaimer, the term of this patent is extended or adjusted under 35 U.S.C. 154(b) by 702 days.

This patent is subject to a terminal disclaimer.

(21) Appl. No.: 13/552,939

(22) Filed: Jul. 19, 2012

(65) Prior Publication Data

US 2012/0279618 A1     Nov. 8, 2012

Related U.S. Application Data

(62) Division of application No. 12/624,472, filed on Nov. 24, 2009, now Pat. No. 8,871,041.

(30) Foreign Application Priority Data

Nov. 28, 2008    (JP) ................................. 2008-303688

(51) Int. Cl.
     *C22C 9/00*        (2006.01)
     *C22F 1/08*        (2006.01)

(52) U.S. Cl.
     CPC .................. *C22C 9/00* (2013.01); *C22F 1/08* (2013.01); *H01L 2924/0002* (2013.01)

(58) Field of Classification Search
     CPC ..... C22C 9/00; C22C 9/02; C22C 9/04; C22F 1/08

(Continued)

(56) References Cited

U.S. PATENT DOCUMENTS 2,943,960 A     7/1960   Saarivirta
4,599,119 A   *   7/1986   Ikushima .................. C22C 9/00
                                                       148/411

(Continued)

FOREIGN PATENT DOCUMENTS

EP           1967596 A1     9/2008
JP           07258803 A     9/1995

*Primary Examiner* — Keith Walker
*Assistant Examiner* — John A Hevey
(74) *Attorney, Agent, or Firm* — Bachman & LaPointe, PC

(57) ABSTRACT

A sheet material of a copper alloy has a chemical composition comprising 1.2 to 5.0 wt % of titanium, and the balance being copper and unavoidable impurities, the material having a mean crystal grain size of 5 to 25 μm and (maximum crystal grain size−minimum crystal grain size)/(mean crystal grain size) being 0.20 or less, assuming that the maximum, minimum and mean values of mean values, each of which is the mean value of crystal grain sizes in a corresponding one of a plurality of regions which are selected from the surface of the sheet material at random and which have the same shape and size, are the maximum, minimum and mean crystal grain sizes, respectively, and the material having a crystal orientation satisfying $I\{420\}/I_0\{420\} > 1.0$, assuming that the intensities of X-ray diffraction on the {420} crystal plane of the surface of the material and the standard powder of pure copper are $I\{420\}$ and $I_0\{420\}$, respectively.

12 Claims, 8 Drawing Sheets

(58) Field of Classification Search
USPC .......................................... 148/554; 420/492
See application file for complete search history.

(56) References Cited

U.S. PATENT DOCUMENTS

| | | |
|---|---|---|
| 8,097,102 B2 * | 1/2012 | Gao et al. ..................... 148/682 |
| 2004/0166017 A1 * | 8/2004 | Caron et al. .................. 420/492 |
| 2006/0204396 A1 | 9/2006 | Sugawara et al. |
| 2014/0283963 A1 * | 9/2014 | Gao et al. ..................... 148/685 |

\* cited by examiner

COPPER ALLOY PLATE AND METHOD FOR PRODUCING SAME

CROSS REFERENCE TO RELATED APPLICATION(S)

The instant application is a divisional application of U.S. patent application Ser. No. 12/624,472, filed Nov. 24, 2009, entitled COPPER ALLOY PLATE AND METHOD FOR PRODUCING SAME.

BACKGROUND OF THE INVENTION

Field of the Invention

The present invention generally relates to a copper alloy plate, such as a copper alloy sheet, and a method for producing the same. More specifically, the invention relates to a plate material, such as a sheet material, of a copper alloy containing titanium (a sheet material of a Cu—Ti alloy), which is used as the material of electric and electronic parts, such as connectors, lead frames, relays and switches, and a method for producing the same.

Description of the Prior Art

The materials used for electric and electronic parts, such as connectors, lead frames, relays and switches, are required to have such a high strength that the materials can withstand stress applied thereto during the assembly and operation of electric and electronic apparatuses using the parts. The materials used for electric and electronic parts, such as connectors, are also required to have an excellent bending workability since the parts are generally formed by bending. Moreover, in order to ensure the contact reliability between electric and electronic parts, such as connectors, the materials used for the parts are required to have an excellent stress relaxation resistance, i.e., a resistance to such a phenomenon (stress relaxation) that the contact pressure between the parts is deteriorated with age.

In recent years, there is a tendency for electric and electronic parts, such as connectors, to be integrated, miniaturized and lightened. In accordance therewith, the sheet materials of copper and copper alloys serving as the materials of the parts are required to be thinned, so that the required strength level of the materials is more severe. Specifically, the 0.2% yield strength of the materials is desired to be the strength level of not less than 850 MPa, preferably not less than 900 MPa, and more preferably not less than 950 MPa.

In accordance with the miniaturization and complicated shape of electric and electronic parts, such as connectors, it is required to improve the precision of shape and dimension of products manufactured by bending the sheet materials of copper alloys. As the requirements for products manufactured by bending the sheet materials of copper alloys, it is not only important to produce no cracks in the bent portions of the products, but it is also important to ensure the precision of shape and dimension of the products. Moreover, there is a problem in that spring back occurs in the bending of the sheet materials of copper alloys. Furthermore, the "spring back" means such a phenomenon that the shape of a final product is not in conformity with the shape of a product worked in a die since the resilient recovery of the product occurs when the product is taken off from the die after the working of a sheet material.

In particular, the problem on the spring back is easy to be explicit as the required strength level of the materials is more severe. For example, there are some cases where the shape and dimension of connecter terminals having portions manufactured by box-bending are deviated, so that the connector terminals can not be used. For that reason, there is recently often applied a so-called bending after notching wherein a sheet material is bent along a notch which is formed by carrying out notching (working for forming the notch) in a portion of the sheet material. However, in the bending after notching, portions near the notch portion are work-hardened by notching, so that cracks are easily produced in the subsequent bending operation. Therefore, the bending after notching is a very severe bending process for materials.

Moreover, the requirements for the stress relaxation resistance of electric and electronic parts, such as connectors, are more severe as the increase of cases where the parts are used in severe environments. For example, the stress relaxation resistance of electric and electronic parts, such as connectors, is particularly important when the parts are used for automobiles in high-temperature environments. Furthermore, the stress relaxation resistance is such a kind of creep phenomenon that the contact pressure on a spring portion of a material forming electric and electronic parts, such as connectors, is deteriorated with age in a relatively high-temperature (e.g., 100 to 200° C.) environment even if it is maintained to be a constant contact pressure at ordinary temperature. That is, the stress relaxation resistance is such a phenomenon that the stress applied to a metal material is relaxed by plastic deformation produced by the movement of dislocation, which is caused by the self-diffusion of atoms forming a matrix and the diffusion of the solid solution of atoms, in a state that the stress is applied to the metal material.

However, there are trade-off relationships between the strength and bending workability of a sheet material of a metal and between the bending workability and stress relaxation resistance thereof, respectively, and conventionally, a sheet material having a good strength, bending workability or stress relaxation resistance is suitably chosen in accordance with the use thereof as a material used for a current-carrying part, such as a connector.

Among the sheet materials of copper alloys, the sheet materials of Cu—Ti alloys have the next highest strength to the sheet materials of Cu—Be alloys and a superior stress relaxation resistance to that of the sheet materials of Cu—Be alloys, and are more advantageous than the sheet materials of Cu—Be alloys in view of costs and environmental loads. For that reason, the sheet materials of Cu—Ti alloys (e.g., C199 (Cu-3.2 wt % of Ti)) are substituted for part of the sheet materials of Cu—Be alloys to be used as connector materials and so forth. However, it is known that the sheet materials of Cu—Ti alloys have a lower strength than that of the sheet materials of Cu—Be alloys (e.g., C17200) having a high strength if they have the same bending workability as that of the sheet materials of Cu—Be alloys, and that the sheet materials of Cu—Ti alloys have an inferior bending workability to that of the sheet materials of Cu—Be alloys if they have the same strength as that of the sheet materials of Cu—Be alloys.

As methods for improving the strength of the sheet materials of Cu—Ti alloys, there are a method for increasing the content of Ti, and a method for choosing a high temper material. However, in the method for increasing the content of Ti, if the concentration of Ti in a sheet material of a Cu—Ti alloy is too high (for example, if the content of Tl is not less than 5 wt %), cracks are easily produced in the sheet material during hot rolling and cold rolling, so that the productivity of the sheet material is remarkably deteriorated. In addition, large deposits are easily produced, so that the sheet material being the final product can not be utilized as a material for general electric and electronic parts since the bending workability of the sheet material is deteriorated although the strength thereof is high. On the other hand, in the method for choosing a high temper material, the strength of the sheet material is improved by increasing the rolling reduction before and after an ageing treatment, so that the sheet material being the final product has anisotropy although the strength thereof is high. That is, it is known that the bending workability of the sheet material in a direction perpendicular to a rolling direction (i.e., the bending workability of the sheet material in a so-called "bad way" in which the bending axis of the sheet material is parallel to the rolling direction) is remarkably bad, although the bending workability of the sheet material in a direction parallel to the rolling direction (i.e., the bending workability of the sheet material in a so-called "good way" in which the bending axis of the sheet material is perpendicular to the rolling direction on the rolled surface) is relatively good.

Generally, in order to improve the bending workability of the sheet materials of copper alloys, a method for fining the crystal grains of the copper alloys is effective. This is the same in the case of the sheet materials of Cu—Ti alloys. However, since the area of grain boundaries existing per a unit volume is increased as the crystal grain size is decreased, it is caused to promote stress relaxation being a kind of creep phenomenon if the crystal grains are fined. In addition, in sheet materials used in relatively high-temperature environments, the diffusion rate along the grain boundaries of atoms is far higher than that in the grains, so that there is a problem in that the original stress relaxation resistance of the sheet materials is deteriorated if the crystal grains are extremely fined (e.g., if the crystal grains are fined so as to have a grain size of 5 μm or less).

In particular, the sheet materials of Cu—Ti alloys have characteristics wherein deposits exist mainly in the form of a modulation structure (spinodal structure) in crystal grains, and the amount of deposits of particles in the second phase having the function of pinning the growth of recrystallized grains is relatively small, so that a mixed grain structure is easily caused by a difference in generating time of recrystallized grains during a solution treatment. Therefore, it is not easy to generate uniform and fine crystal grains.

In recent years, as methods for improving the characteristics of the sheet materials of Cu—Ti alloys, there are proposed a method for fining crystal grains and a method for controlling crystal orientation (texture) (see, e.g., Japanese Patent Laid-Open Nos. 2002-356726, 2004-231985, 2006-241573 and 2006-274289).

In Cu—Ti alloys, Ti exists in two forms, one of which is the form of a modulation structure (spinodal structure) having a periodical variation in concentration in a parent phase, and the other of which is the form of an intermetallic compound of Ti and Cu which are particles in the second phase (beta phases). The modulation structure is a structure which is generated by continuous fluctuation in concentration of Ti solute atoms and which is generated while holding the complete consistency with the parent phase. The sheet materials of Cu—Ti alloys having such a modulation structure are remarkably hardened, and have a small loss of ductility (bending workability). On the other hand, beta phases are deposits which are sprinkled in usual crystal grains and grain boundaries. Such beta phases are easily coarsened, and cause a remarkably great loss of ductility of the sheet materials although the function of hardening the sheet materials is extremely small by the modulation structure.

That is, in order to obtain the sheet materials of Cu—Ti alloys having both of a high strength and a good bending workability, it is effective to develop the modulation structure of the sheet materials while suppressing the generation of beta phases thereof. In addition, another important factor influencing on the bending workability of the sheet materials of Cu—Ti alloys is the crystal grain size of the alloys. As the crystal grain size of the alloys is decreased, the strain due to bending deformation can be dispersed to improve the bending workability of the sheet materials.

However, the crystal grain sizes of the sheet materials of Cu—Ti alloys are determined by recrystallization in the final solution treatment, and there is a problem in that the crystal grains are easily coarsened if the generation of beta phases having the function of pinning the growth of recrystallization is suppressed. In addition, the sheet materials of Cu—Ti alloys have such characteristics that the mixed grain structure is easily caused by a difference in generating time of recrystallized grains during a solution treatment. Therefore, it is not easy to generate uniform and fine crystal grains, so that cracks are easily produced near the boundaries of structures having different crystal grain sizes during bending deformation. Moreover, there is a problem in that the anisotropy in bending workability is easily caused if the rolling reduction before and after an ageing treatment is increased in order to improve the strength of the sheet materials of Cu—Ti alloys.

As a typical method for fining the crystal grains of the sheet material of a copper alloy having a chemical composition, there is a method for carrying out a solution treatment at a temperature of not higher than the solid solubility curve (solvus) of the copper alloy having the chemical composition. If the crystal grains of the sheet materials of Cu—Ti alloys are fined by this method, the solid solution of the total amount of Ti is not formed, and part of Ti is caused to remain as beta phases having the function of pinning. Therefore, although the crystal grains can be fined, the effect of improvement of bending workability due to the fining of crystal grains is offset by residual beta phases.

For example, in the method disclosed in Japanese Patent Laid-Open No. 2002-356726, a solution treatment is carried out at a lower temperature than the solid solubility curve of an alloy having a chemical composition by 10 to 60° C., so that the sheet material of a Cu—Ti alloy having a 0.2% yield strength of about 900 MPa can be obtained, but the ratio R/t of the minimum bending radius R to the thickness t of the sheet material in bending in the bad way remains a relatively great value of about 5.

In the method disclosed in Japanese Patent Laid-Open No. 2004-231985, Fe, Co, Ni and so forth are added to Cu—Ti alloys to form the intermetallic compounds of additional elements, such as Ti and Fe, so that the intermetallic compounds pin the boundaries of recrystallized grains to fine crystal grains in place of beta phases. However, there are disadvantages in that the development of the modulation structure of Ti is inhibited by the formation of the intermetallic compounds of the third element, such as Fe, and Ti, so that it is not possible to sufficiently improve the characteristics.

In the method disclosed in Japanese Patent laid-Open No. 2006-241573, the ratio of the intensity of X-ray diffraction on the {220} plane of a sheet material to that on the {111} plane thereof is set to be I{220}/I{111}>4 in order to improve the strength and electric conductivity of sheet material. If the rolling texture of the sheet material is adjusted so that the sheet material has a principal orientation component of {220}, it is effective to improve the strength and electric conductivity of the sheet material. However, it was found that the {220} plane was the rolling texture, so that the bending workability of the sheet material in the bad way was remarkably deteriorated.

In the method disclosed in Japanese Patent Laid-Open No. 2006-274289, in order to improve the bending workability of sheet materials, the texture of the sheet materials is controlled so that the maximum value of the intensities of X-ray diffraction in four regions including {110}<115>, {110}<114> and {110}<113> on a {111} positive pole figure is in the range of from 5.0 to 15.0 (a ratio of intensity to a random orientation). In addition, in order to obtain such a texture, the cold-rolling reduction is set to be in the range of from 85% to 97% before a solution treatment. Such a texture is a typical alloy-type texture ({110}<112>-{110}<100>), and the {111} positive pole figure thereof is similar to the {111} positive pole figure of 70/30 brass (see, e.g., "Metal Data Book", third revision, p 361, edited by Japan Society for Metals, published by Maruzen Corporation). Thus, in the conventional method for adjusting the distribution in crystal orientation on the basis of the typical texture, it is difficult to greatly improve the bending workability of the sheet materials. In the above-described method disclosed in Japanese Patent Laid-Open No. 2006-274289, it is possible to obtain a sheet material of a Cu—Ti alloy having a 0.2% yield strength of about 870 MPa, but the ratio R/t of the minimum bending radius R to the thickness t of the sheet material in bending remains a relatively great value of about 1.6.

In order to improve the precision of shape and dimension of products manufactured by bending, it is effective to use the bending after notching for the sheet materials of copper alloys. However, in the sheet materials of Cu—Ti alloys wherein crystal grains and textures are controlled by the above-described methods disclosed in Japanese Patent Laid-Open Nos. 2002-356726, 2004-231985, 2006-241573 and 2006-274289, it was not considered to prevent cracks from being produced by the bending after notching, so that it was found that the bending workability after notching was not sufficiently improved.

In the sheet materials of Cu—Ti alloys, there is also a problem in that it is difficult to ensure the precision of shape and dimension of products, which are manufactured by bending, due to spring back. The bending after notching is effective in order to reduce spring back. In the bending after notching, portions near the notched portion are work-hardened by notching, so that cracks are easily produced in the subsequent bending. For that reason, in the sheet materials of Cu—Ti alloys, the bending after notching has not been adopted industrially in the present circumstances.

Moreover, if crystal grains are fined as described above, it is disadvantageous in order to overcome a stress relaxation being a kind of creep phenomenon although it is effective in order to improve the bending workability of the sheet materials to some extent. Thus, it is difficult to improve the stress relaxation resistance of the sheet materials in circumstances where it is difficult to sufficiently improve the bending workability thereof.

SUMMARY OF THE INVENTION

It is therefore an object of the present invention to eliminate the aforementioned problems and to provide a sheet material of a Cu—Ti alloy having an excellent bending workability, such as an excellent bending workability after notching, and an excellent stress relaxation resistance while maintaining a high strength, and a method for producing the same.

In order to accomplish the aforementioned and other objects, the inventors have diligently studied and found that it is possible to produce a sheet material of a Cu—Ti alloy having an excellent bending workability, such as an excellent bending workability after notching, and an excellent stress relaxation resistance while maintaining a high strength, if the sheet material of a copper alloy has a chemical composition comprising 1.2 to 5.0 wt % of titanium, and the balance being copper and unavoidable impurities, and if the sheet material has a mean crystal grain size of 5 to 25 µm, and (maximum crystal grain size−minimum crystal grain size)/(mean crystal grain size) being not greater than 0.20, assuming that the maximum value of mean values, each of which is the mean value of crystal grain sizes in a corresponding one of a plurality of regions which are selected from a surface of the sheet material of the copper alloy at random and which have the same shape and size, is the maximum crystal grain size, that the minimum value of the mean values is the minimum crystal grain size and that the mean value of the mean values is the mean crystal grain size, and if the sheet material has a crystal orientation which satisfies $I\{420\}/I_0\{420\}>1.0$, assuming that the intensity of X-ray diffraction on the {420} crystal plane on the surface of the sheet material of the copper alloy is $I\{420\}$ and that the intensity of X-ray diffraction on the {420} crystal plane of the standard powder of pure copper is $I_0\{420\}$. Thus, the inventors have made the present invention.

According one aspect of the present invention, there is provided a sheet material of a copper alloy having a chemical composition comprising 1.2 to 5.0 wt % of titanium, and the balance being copper and unavoidable impurities, wherein the sheet material of the copper alloy has a mean crystal grain size of 5 to 25 µm, and (maximum crystal grain size−minimum crystal grain size)/(mean crystal grain size) is not greater than 0.20, assuming that the maximum value of mean values, each of which is the mean value of crystal grain sizes in a corresponding one of a plurality of regions which are selected from a surface of the sheet material of the copper alloy at random and which have the same shape and size, is the maximum crystal grain size, that the minimum value of the mean values is the minimum crystal grain size and that the mean value of the mean values is the mean crystal grain size, and wherein the sheet material of the copper alloy has a crystal orientation which satisfies $I\{420\}/I_0\{420\}>1.0$, assuming that the intensity of X-ray diffraction on the {420} crystal plane on the surface of the sheet material of the copper alloy is $I\{420\}$ and that the intensity of X-ray diffraction on the {420} crystal plane of the standard powder of pure copper is $I_0\{420\}$.

In this sheet material of the copper alloy, the crystal orientation of the sheet material of the copper alloy preferably satisfies $I\{220\}/I_0\{220\}\leq 4.0$, assuming that the intensity of X-ray diffraction on the {220} crystal plane on the surface of the sheet material of the copper alloy is $I\{220\}$ and that the intensity of X-ray diffraction on the {220} crystal plane of the standard powder of pure copper is $I_0\{220\}$.

The chemical composition of the sheet material of the copper alloy may further comprise one or more elements which are selected from the group consisting of 1.5 wt % or less of nickel, 1.0 wt % or less of cobalt and 0.5 wt % or less of iron.

The chemical composition of the sheet material of the copper alloy may further comprise one or more elements which are selected from the group consisting of 1.2 wt % or less of tin, 2.0 wt % or less of zinc, 1.0 wt % or less of magnesium, 1.0 wt % or less of zirconium, 1.0 wt % or less of aluminum, 1.0 wt % or less of silicon, 0.1 wt % or less of phosphorus, 0.05 wt % or less of boron, 1.0 wt % or less of chromium, 1.0 wt % or less of manganese, 1.0 wt % or less of vanadium, 1.0 wt % or less of silver, 1.0 wt % or less of beryllium and 1.0 wt % or less of misch metal, the total amount of these elements being 3 wt % or less.

The sheet material of the copper alloy preferably has a 0.2% yield strength of 850 MPa or more. If the 90° W bending test of a first test piece, which is cut off from the sheet material of the copper alloy so that the longitudinal direction of the first test piece is the rolling direction LD of the sheet material of the copper alloy, is carried out so that the bending axis of the first test piece is a direction TD perpendicular to the rolling direction and thickness direction of the first test piece, and if the 90° W bending test of a second test piece, which is cut off from the sheet material of the copper alloy so that the longitudinal direction of the second test piece is the TD, is carried out so that the bending axis of the second test piece is the LD, the ratio R/t of the minimum bending radius R to the thickness t of each of the first and second test pieces is preferably 1.0 or less.

According to another aspect of the present invention, there is provided a method for producing a sheet material of a copper alloy, the method comprising the steps of: melting and casting raw materials of a copper alloy to form an ingot, the copper alloy having a chemical composition which consists of: 1.2 to 5.0 wt % of titanium; optionally one or more elements which are selected from the group consisting of 1.5 wt % or less of nickel, 1.0 wt % or less of cobalt and 0.5 wt % or less of iron; optionally one or more elements which are selected from the group consisting of 1.2 wt % or less of tin, 2.0 wt % or less of zinc, 1.0 wt % or less of magnesium, 1.0 wt % or less of zirconium, 1.0 wt % or less of aluminum, 1.0 wt % or less of silicon, 0.1 wt % or less of phosphorus, 0.05 wt % or less of boron, 1.0 wt % or less of chromium, 1.0 wt % or less of manganese, 1.0 wt % or less of vanadium, 1.0 wt % or less of silver, 1.0 wt % or less of beryllium and 1.0 wt % or less of misch metal, the total amount of these elements being 3 wt % or less; and the balance being copper and unavoidable impurities; hot-rolling the ingot in a temperature range of from 950° C. to 500° C. to form a plate of the copper alloy, by hot-rolling the ingot at a rolling reduction of not less than 30% in a temperature range of from less than 700° C. to 500° C. after carrying out an initial rolling pass in a temperature range of from 950° C. to 700° C.; cold-rolling the plate of the copper alloy at a rolling reduction of not less than 85%; carrying out a solution treatment which holds the plate of the copper alloy in a temperature range of from 750° C. to 1000° C. for 5 seconds to 5 minutes; cold-rolling the plate of the copper alloy at a rolling reduction of 0 to 50% after the solution treatment; ageing the cold-rolled plate of the copper alloy, which is cold-rolled after the solution treatment, at a temperature of 300 to 550° C.; and finish cold-rolling the aged plate of the copper alloy at a rolling reduction of 0 to 30%.

In this method for producing a sheet material of a copper alloy, the ingot is preferably hot-rolled at a rolling reduction of not less than 60% in the temperature range of from 950° C. to 700° C. The rolling reduction in cold-rolling between the hot-rolling and the solution treatment is preferably not less than 90%. The solution treatment is preferably carried out by a heat treatment which holds the plate of the copper alloy at a higher temperature than a solid solubility curve of the copper alloy by 30° C. or more, in the temperature range of from 750° C. to 1000° C. for a holding period of time which is adjusted so that the mean crystal grain size of the sheet material of the copper alloy after the solution treatment is in the range of from 5 μm to 25 μm.

In the method for producing a sheet material of a copper alloy, assuming that the ageing temperature capable of obtaining the maximum hardness in the chemical composition of the copper alloy is $T_M$ (° C.) and that the maximum hardness thereof is $H_M$ (HV), the ageing temperature in the ageing treatment is preferably set to be a temperature which is $T_M \pm 10°$ C. in the temperature range of from 300° C. to 550° C., and the ageing time in the ageing treatment is preferably set so that the hardness of the plate of the copper alloy is in the range of from 0.90 $H_M$ to 0.95 $H_M$ after the ageing treatment.

In the method for producing a sheet material of a copper alloy, a low temperature annealing operation may be carried out at a temperature of 150 to 450° C. after the finish cold rolling.

According to a further aspect of the present invention, there is provided a connector terminal using the above-described sheet material of a copper alloy as a material thereof.

Throughout the specification, the "maximum crystal grain size" means the maximum value of mean values, each of which is the mean value of crystal grain sizes in a corresponding one of a plurality of regions selected from the surface (rolled surface) of a sheet material of a copper alloy at random, the plurality of regions having the same shape and size. For example, from the optical microphotograph of the surface (rolled surface) of a sheet material of a copper alloy, ten square visual fields having a size of 100 μm×100 μm are selected at random, two sides of each of the visual fields being parallel to the rolling direction (LD) and the other two sides of each of the visual fields being parallel to a direction (TD) perpendicular to the rolling direction. In each of the visual fields, crystal grain sizes are measured by the method of section based on JIS H0501. Then, the mean values $d_1, d_2, \ldots, d_{10}$ of the crystal grain sizes in the visual fields are calculated, respectively. The maximum value of the mean values thus calculated is the maximum crystal grain size. The "minimum crystal grain size" means the minimum value of the mean values of crystal grain sizes in the above-described regions. For example, the "minimum crystal grain size" means the minimum value of the mean values $d_1, d_2, \ldots, d_{10}$ of the crystal grain sizes in the visual fields. The "mean crystal grain size" means the mean value of the mean values of crystal grain sizes in the above-described regions. For example, the "mean crystal grain size" means the mean value $d_{mean}$ (=$(d_1+d_2+\ldots+d_{10})/10$) of the mean values $d_1, d_2, \ldots, d_{10}$ of the crystal grain sizes in the visual fields. Furthermore, the crystal grain sizes in each of the visual fields can be obtained by measuring the length of each of crystal grains, which are completely cut by line segments extending in a direction (TD) perpendicular to the rolling direction and having a length of 100 μm, by the method of section based on JIS H0501.

According to the present invention, it is possible to provide a sheet material of a Cu—Ti alloy having an excellent bending workability, such as an excellent bending workability after notching, and an excellent stress relaxation resistance while maintaining a high strength, and a method for producing the same.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Figure 1:
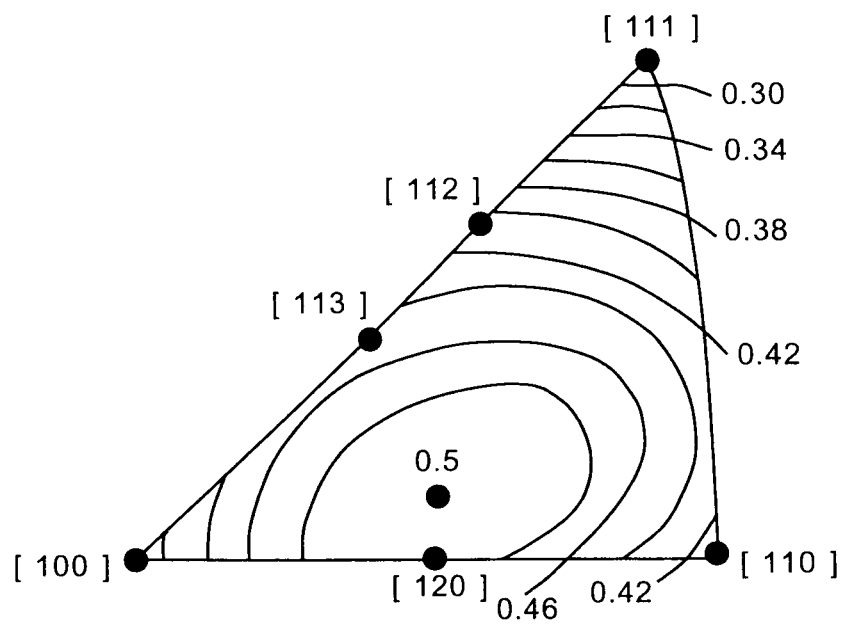
FIG. 1 is a standard reversed pole figure which shows the Schmid factor distribution of a face-centered cubic crystal.

The preferred embodiment of a sheet material of a copper alloy according to the present invention has a chemical composition consisting of: 1.2 to 5.0 wt % of titanium (Ti); optionally one or more elements which are selected from the group consisting of 1.5 wt % or less of nickel (Ni), 1.0 wt % or less of cobalt (Co) and 0.5 wt % or less of iron (Fe); optionally one or more elements which are selected from the group consisting of 1.2 wt % or less of tin (Sn), 2.0 wt % or less of zinc (Zn), 1.0 wt % or less of magnesium (Mg), 1.0 wt % or less of zirconium (Zr), 1.0 wt % or less of aluminum (Al), 1.0 wt % or less of silicon (Si), 0.1 wt % or less of phosphorus (P), 0.05 wt % or less of boron (B), 1.0 wt % or less of chromium (Cr), 1.0 wt % or less of manganese (Mn), 1.0 wt % or less of vanadium (V), 1.0 wt % or less of silver (Ag), 1.0 wt % or less of beryllium (Be) and 1.0 wt % or less of misch metal, the total amount of these elements being 3 wt % or less; and the balance being copper and unavoidable impurities.

The sheet material of the copper alloy has a mean crystal grain size of 5 to 25 μm, wherein (maximum crystal grain size−minimum crystal grain size)/(mean crystal grain size) is not greater than 0.20, assuming that the maximum value of mean values, each of which is the mean value of crystal grain sizes in a corresponding one of a plurality of regions selected from the surface of the sheet material of the copper alloy at random, the regions having the same shape and size, is the maximum crystal grain size, that the minimum value of the above-described mean values is the minimum crystal grain size and that the mean value of the above-described mean values is the mean crystal grain size.

The sheet material of the copper alloy has a crystal orientation which satisfies $I\{420\}/I_0\{420\}>1.0$, assuming that the intensity of X-ray diffraction on the $\{420\}$ crystal plane on the surface of the sheet material of the copper alloy is $I\{420\}$ and that the intensity of X-ray diffraction on the $\{420\}$ crystal plane of the standard powder of pure copper is $I_0\{420\}$, and which satisfies $I\{220\}/I_0\{220\}\leq4.0$, assuming that the intensity of X-ray diffraction on the $\{220\}$ crystal plane on the surface of the sheet material of the copper alloy is $I\{220\}$ and that the intensity of X-ray diffraction on the $\{220\}$ crystal plane of the standard powder of pure copper is $I_0\{220\}$.

The sheet material of the copper alloy preferably has a 0.2% yield strength of 850 MPa or more in the LD (rolling direction) thereof. The sheet material of the copper alloy preferably has such a bending workability that the ratio R/t of the minimum bending radius R, at which cracks are not produced in the 90° W bending test based on JIS H3110, to the thickness t of the sheet material is 1.0 or less in each of the LD and TD (the direction perpendicular to the rolling direction and thickness direction) thereof.

[Composition of Alloy]

The sheet material of the copper alloy according to the present invention is a sheet material of a Cu—Ti alloy containing Cu and Ti, preferably an alloy consisting of two elements of Cu and Ti. The sheet material of the copper alloy may optionally contain a small amount of other elements, such as Ni, Co and Fe.

Titanium (Ti) is an element having an excellent age hardening function in a Cu matrix, and contributes to the improvement of the strength and stress relaxation resistance of the sheet material of the copper alloy. In a plate of a Cu—Ti alloy, a supersaturated solid solution is generated by a solution treatment. Then, if ageing is carried out at a lower temperature, a modulation structure (spinodal structure), which is a metastable phase, is developed. Then, if ageing is continued, stable phases (beta phases) are generated. The modulation structure does not require any nucleation, dislike usual deposits generated by nucleation and growth. The modulation structure is a structure which is generated by continuous fluctuation in concentration of solute atoms and which is generated while holding the complete consistency with the parent phase. At the developmental stage of the modulation structure, the sheet material of the Cu—Ti alloy is remarkably hardened, and has a small loss of ductility. On other hand, the stable phases (beta phases) are deposits which are sprinkled in usual crystal grains and grain boundaries. The stable phases are easily coarsened, and cause a great loss of ductility of the sheet material although the function of hardening the sheet material is smaller than that in the modulation structure which is a metastable phase.

Therefore, the strength of the sheet material of the Cu—Ti alloy is preferably enhanced by the metastable phases as many as possible, while suppressing the generation of the stable phases (beta phases). If the content of Ti is less than 1.2 wt %, it is difficult to sufficiently obtain the function of strengthening the sheet material by the metastable phases. On the other hand, if the content of Ti exceeds 5.0 wt % to be excessive, the stable phases (beta phases) are easily generated, and cracks are easily produced in hot working and cold working, so that the productivity of the sheet material is easily deteriorated. In addition, the temperature range capable of carrying out a solution treatment is caused to be narrow, so that it is difficult to cause the sheet material of the Cu—Ti alloy to have good characteristics. Therefore, the content of Ti is preferably in the range of from 1.2 wt % to 5.0 wt %, more preferably in the range of from 2.0 wt % to 4.0 wt %, and most preferably in the range of from 2.5 wt % to 3.5 wt %.

Nickel (Ni), cobalt (Co) and iron (Fe) are elements which form intermetallic compounds with Ti to contribute to the improvement of the strength of the sheet material of the copper alloy. At least one of these elements may be optionally added to the copper alloy. In particular, since the intermetallic compounds inhibit crystal grains from being coarsened in the solution treatment of Cu—Ti alloys, the solution treatment can be carried out at a higher temperature, so that the addition of Ni, Co and Fe is advantageous in order to sufficiently generate the solid solution of Ti. However, if the contents of Fe, Co and Ni are excessive, the amount of Ti consumed by the generation of the intermetallic compounds is increased, so that the amount of Ti to be formed as the solid solution is necessarily decreased to easily lower the strength of the sheet material. Therefore, if Ni, Co and Fe are added to the copper alloy, the content of Ni is preferably 1.5 wt % or less, more preferably in the range of from 0.05 wt % to 1.5 wt %, and most preferably in the range of from 0.1 wt % to 1.0 wt %, the content of Co is preferably 1.0 wt % or less, more preferably in the range of from 0.05 wt % to 1.0 wt %, and most preferably in the range of from 0.1 wt % to 0.5 wt %, and the content of Fe is preferably 0.5 wt % or less, more preferably in the range of from 0.05 wt % t 0.5 wt %, and most preferably in the range of from 0.1 wt % to 0.3 wt %.

Tin (Sn) has the functions of carrying out the solid-solution strengthening (or hardening) of the copper alloy and of improving the stress relaxation resistance of the sheet material thereof. In order to sufficiently provide these functions, the content of Sn is preferably 0.1 wt % or more. However, if the content of Sn exceeds 1.0 wt %, the castability and electric conductivity of the copper alloy are remarkably lowered. Therefore, if the copper alloy contains Sn, the content of Sn is preferably in the range of from 0.1 wt % to 1.0 wt %, and more preferably in the range of from 0.1 wt % to 0.5 wt %.

Zinc (Zn) has the function of improving the castability of the copper alloy, in addition to the function of improving the solderability and strength thereof. In order to sufficiently provide these functions, the content of Zn is preferably 0.1 wt % or more. If the copper alloy contains Zn, inexpensive brass scraps may be used. However, if the content of Zn exceeds 2.0 wt %, the electric conductivity and stress corrosion cracking resistance of the sheet material of the copper alloy are easily deteriorated. Therefore, if the copper alloy contains Zn, the content of Zn is preferably in the range of from 0.1 wt % to 2.0 wt %, and more preferably in the range of from 0.3 wt % to 1.0 wt %.

Magnesium (Mg) has the function of improving the stress relaxation resistance of the sheet material of the copper alloy, and the function of desulfurizing the sheet material of the copper alloy. In order to sufficiently provide these functions, the content of Mg is preferably 0.01 wt % or more. However, Mg is an element which is easily oxidized, and the castability of the copper alloy is remarkably deteriorated if the content of Mg exceeds 1.0 wt %. Therefore, if the copper alloy contains Mg, the content of Mg is preferably in the range of from 0.01 wt % to 1.0 wt %, and more preferably in the range of from 0.1 wt % to 0.5 wt %.

As other elements, the copper alloy may optionally contain at least one element which is selected from the group consisting 1.0 wt % or less of Zr, 1.0 wt % or less of Al, 1.0 wt % or less of Si, 0.1 wt % or less of P, 0.05 wt % or less of B, 1.0 wt % or less of Cr, 1.0 wt % or less of Mn, 1.0 wt % or less of V, 1.0 wt % or less of Ag, 1.0 wt % or less of Be, and 1.0 wt % or less of misch metal. For example, Zr and Al can form intermetallic compounds with Ti, and Si can generate deposits with Ti. In addition, Cr, Zr, Mn and V are easy to form high melting point compounds with S, Pb and so forth, which exist as unavoidable impurities in the copper alloy, and Cr, B, P, Zr and misch metal (a mixture of rare earth elements containing Ce, La, Dy, Nd, Y and so forth) have the function of fining the cast structure of the copper alloy to contribute to the improvement of the hot workability thereof. Moreover, Ag and Be have the function of improving the strength of the sheet material of the copper alloy without greatly deteriorating the electric conductivity thereof.

If the copper alloy contains at least one element which is selected from the group consisting of Zr, Al, Si, P, B, Cr, Mn, V, Ag, Be and misch metal, the total amount of these elements is preferably 0.01 wt % or more in order to sufficiently provide the function of each element. However, if a large amount of these elements are contained in the copper alloy, the elements have a bad influence on the hot workability and cold workability thereof, and it is unfavorable with respect to costs. Therefore, the total amount of Sn, Zn, Mg, Zr, Al, Si, P, B, Cr, Mn, V, Ag, Be and misch metal is preferably 3 wt % or less, and more preferably 2 wt % or less, and more preferably 1 wt % or less, and most preferably 0.5 wt % or less.

[Mean Crystal Grain Size]

The decrease of the mean crystal grain size of the copper alloy is advantageous to improve the bending workability of the sheet material thereof. However, in Cu—Ti alloys, there is a problem in that beta phases are easy to remain as crystal grains are fined. If the mean crystal grain size of the copper alloy is too small, the stress relaxation resistance of the sheet material thereof is easy to deteriorate. If the mean crystal grain size of the copper alloy is not less than 5 µm, preferably not less than 8 µm, it is easy to ensure the stress relaxation resistance of the sheet material thereof to such an extent that the sheet material thereof can be satisfactorily used as the material of connectors for automobiles. The mean crystal grain size of the copper alloy is more preferably not less than 10 µm. However, if the mean crystal grain size of the copper alloy is too large, the surface of the bent portion of the sheet material thereof is easy to be rough, so that there are some cases where the bending workability of the sheet material thereof is deteriorated. Therefore, the mean crystal grain size of the copper alloy is preferably not greater than 25 µm, more preferably not greater than 20 µm, and most preferably not greater than 15 µm. The final mean crystal grain size of the copper alloy is roughly determined by crystal grain sizes at a stage after a solution treatment. Therefore, the control of the mean crystal grain size of the copper alloy can be carried out by adjusting solution treatment conditions.

[Crystal Grain Size Distribution]

Cu—Ti alloys have such characteristics that a mixed grain structure is easily produced by a difference in time for generating recrystallized grains in a solution treatment, so that cracks are easily produced near the boundaries of structures having different crystal grain sizes during bending deformation. For that reason, (maximum crystal grain size–minimum crystal grain size)/(mean crystal grain size), which indicates the uniformity of crystal grains, is preferably not greater than 0.20 and more preferably not greater than 0.15, assuming that the maximum value of mean values, each of which is the mean value of crystal grain sizes in a corresponding one of a plurality of regions which are selected from the surface of the sheet material of the copper alloy at random and which have the same shape and size, is the maximum crystal grain size, that the minimum value of the above-described mean values is the minimum crystal grain size and that the mean value of the above-described mean values is the mean crystal grain size.

[Texture]

The pattern of X-ray diffraction from the surface (rolled surface) of the sheet material of a Cu—Ti alloy generally comprises the peaks of diffraction on four crystal planes of {111}, {200}, {220} and {311}. The intensities of X-ray diffraction from other crystal planes are far smaller than those from the four crystal planes. In the sheet materials of Cu—Ti alloys manufactured by usual manufacturing processes, the intensity of X-ray diffraction from the {420} plane is negligibly weak. The preferred embodiment of a method for producing a sheet material of a copper alloy according to the present invention can produce a sheet material of a Cu—Ti alloy having a texture wherein the {420} plane is a principal orientation component. It was found that the stronger development of the texture is advantageous in order to improve the bending workability of the sheet material as follows.

There are Schmid factors as indexes which indicate the probability of generating plastic deformation (slip) when an external force is applied to a crystal in a certain direction. Assuming that the angle between the direction of the external force applied to the crystal and the normal line to the slip plane is $\phi$ and that the angle of the direction of the external force applied to the crystal and the slip direction is $\lambda$, the Schmid factors are expressed by $\cos \phi \cdot \cos \lambda$, and the values thereof are not greater than 0.5. If the Schmid factor is greater (i.e., if the Schmid factor approaches 0.5), it means that shearing stress in slip directions is greater. Therefore, if the Schmid factor is greater (i.e., if the Schmid factor approaches 0.5) when an external force is applied to a crystal in a certain direction, the crystal is easily deformed. The crystal structure of Cu—Ti alloys is face centered cubic (fcc). The slip system of a face-centered cubic crystal has a slip plane of {111} and a slip direction of <110>. It is known that an actual crystal is easily deformed to decrease the extent of work hardening as the Schmid factor is greater.

FIG. 1 is a standard reversed pole figure which shows the Schmid factor distribution of a face-centered cubic crystal. As shown in FIG. 1, the Schmid factor in the <120> direction is 0.490 which is close to 0.5. That is, a face-centered cubic crystal is very easy to be deformed if an external force is applied to the crystal in the <120> direction. The Schmid factors in other directions are 0.408 in the <100> direction, 0.445 in the <113> direction, 0.408 in the <110> direction, 0.408 in the <112> direction, and 0.272 in the <111> direction.

The texture having a principal orientation component of {420} means such a texture that the existing rate of crystals is high, the {420} plane, i.e., the {210} plane, of the crystals being substantially parallel to the surface (rolled surface) of the sheet material. In crystals having a principal orientation plane of {210}, the direction (ND) perpendicular to the surface of the sheet material is the <120> direction, and the Schmid factor thereof is close to 0.5. Therefore, the crystals are easily deformed in the direction ND, and the extent of work hardening is small. On other hand, a typical rolling texture of Cu—Ti alloys has a principal orientation component of {220}. In this case, the existing rate of crystals is high, the {220} plane, i.e., the {110} plane, of the crystals is substantially parallel to the surface (rolled surface) of the sheet material. In the crystals having a principal orientation plane of {110}, the direction ND is the <110> direction, and the Schmid factor thereof is about 0.4, so that the extent of work hardening caused by deformation in the direction ND is greater than that in crystals having a principal orientation plane of {210}. In addition, a typical recrystallized texture of Cu—Ti alloys has a principal orientation component of {311}. In crystals having a principal orientation plane of {311}, the direction ND is the <113> direction, and the Schmid factor thereof is about 0.45, so that the extent of work hardening caused by deformation in the direction ND is greater than that in crystals having a principal orientation plane of {210}.

In the bending after notching, the extent of work hardening caused by deformation in the direction ND is extremely important, because notching is deformation in the direction ND, and because the extent of work hardening in portions of the sheet material, the thickness of which is decreased by notching, greatly controls the bending workability of the sheet material when the sheet material is subsequently bent along a notch. Assuming that the intensity of X-ray diffraction on the {420} crystal plane on the surface of the sheet material of the copper alloy is I{420} and that the intensity of X-ray diffraction on the {420} crystal plane of the standard powder of pure copper is $I_0${420}, in the case of such a texture having a principal orientation component of {420} that I{420}/$I_0${420}>1.0 is satisfied, the extent of work hardening caused by notching is smaller than that in the rolling texture or recrystallized texture of conventional Cu—Ti alloys, so that the bending workability after notching is remarkably improved.

In addition, in the case of such a texture having a principal orientation component of {420} that I{420}/$I_0${420}>1.0 is satisfied, crystals having a principal orientation plane of {210} have the <120> and <100> directions as other directions on the surface of the sheet material, i.e., on the {210} plane, and these directions are perpendicular to each other. In fact, the LD is the <100> direction, and the TD is the <120> direction. As an example of crystal orientation, in crystals having a principal orientation plane of (120), the LD is the [011] direction, and the TD is [−2,1,0] direction. The Schmid factors in such crystals are 0.408 in the LD and 0.490 in the TD. On the other hand, in a typical rolling texture of Cu—Ti alloys, the principal orientation plane is the {110} plane, the LD is the <112> direction, and the TD is the <111> direction, the Schmid factors on the surface of the sheet material being 0.408 in the LD and 0.272 in the TD. In a typical recrystallized texture of Cu—Ti alloys, the principal orientation plane is the {113} plane, the LD is the <112> direction, and the TD is the <110> direction, the Schmid factors on the surface of the sheet material being 0.408 in the LD and 0.408 in the TD. If the Schmid factors in the LD and TD are thus considered, deformation on the surface of the sheet material having a texture having a principal orientation component of {420} is easier than that on the surface of a sheet material having the rolling texture or recrystallized texture of conventional Cu—Ti alloys. It is considered that this point is advantageous in order to prevent cracks from being produced in the bending after notching.

When the bending of a sheet material of a metal is carried out, the crystal grains of the metal are not uniformly deformed, and there are crystal grains, which are easily deformed during bending, and crystal grains which are difficult to be deformed during bending, since the crystal orientations of the crystal grains are different from each other. As the extent of bending is increased, the crystal grains being easily deformed are deformed in preference to other crystal grains, and fine irregularities are produced on the surface of the bent portion of the metal sheet by non-uniform deformation between crystal grains. These irregularities are developed to form wrinkles, and to produce cracks (breaks) according to circumstances. As described above, in a sheet material of a metal having such a texture that $I\{420\}/I_0\{420\}>1.0$ is satisfied, crystal grains are easily deformed in the ND and on the surface of the sheet material, in comparison with sheet materials having usual textures. Thus, it is considered that the bending workability after notching and the usual bending workability are remarkably improved even if crystal grains are not particularly fined.

Such a crystal orientation satisfies $I\{420\}/I_0\{420\}>1.0$, assuming that the intensity of X-ray diffraction on the $\{420\}$ crystal plane on the surface of the sheet material of the copper alloy is $I\{420\}$ and that the intensity of X-ray diffraction on the $\{420\}$ crystal plane of the standard powder of pure copper is $I_0\{420\}$. Since reflection does not occur on the $\{210\}$ plane although it occurs on the $\{420\}$ plane in the pattern of X-ray diffraction of a face-centered cubic crystal, the crystal orientation on the $\{210\}$plane is evaluated by reflection on the $\{420\}$ plane.

The texture having a principal orientation component of $\{420\}$ is formed as a recrystallized texture by a solution treatment. However, in order to enhance the strength of the sheet material of the copper alloy, the cold rolling of the sheet material of the copper alloy is preferably carried out after the solution treatment. As the cold-rolling reduction is increased, a rolling texture having a principal orientation component of $\{220\}$ is developed. As the density of orientation of $\{220\}$ is increased, the density of orientation of $\{420\}$ is decreased, but the cold-rolling reduction may be adjusted so as to maintain $I\{420\}/I_0\{420\}>1.0$. However, since there are some cases where the workability of the sheet material of the copper alloy is deteriorated if the texture having a principal orientation component of $\{220\}$ is excessively developed, $I\{220\}/I_0\{220\}\leq 4.0$ is preferably satisfied, assuming that the intensity of X-ray diffraction on the $\{220\}$ crystal plane on the surface of the sheet material of the copper alloy is $I\{220\}$ and that the intensity of X-ray diffract ion on the $\{220\}$ crystal plane of the standard powder of pure copper is $I_0\{220\}$. In order to further improve both of the strength and bending workability of the sheet material of the copper alloy, $1.0\leq I\{220\}/I_0\{220\}\leq 3.0$ is preferably satisfied.

In the sheet material of the copper alloy having such a specific crystal orientation, the high strength inherent in the sheet material of the copper alloy is maintained, and it is not required to extremely fine crystal grains in order to improve the bending workability thereof, so that it is possible to sufficiently provide the function of improving the stress relaxation resistance thereof by adding Ti.

[Characteristics]

In order to further miniaturize and thin electric and electronic parts, such as connectors, using the sheet materials of Cu—Ti alloys, the 0.2% yield strength of the sheet materials is preferably not less than 850 MPa, more preferably not less than 900 MPa, and most preferably not less than 950 MPa. The sheet materials of copper alloys having such strength characteristics can be produced from the raw materials of copper alloys having the above-described chemical compositions by a producing method which will be described later.

As the evaluation of the usual bending workability of the sheet material of the copper alloy, the ratio R/t of the minimum bending radius R to thickness t of the sheet material in the 90° W bending test is preferably 1.0 or less, more preferably 0.5 or less, in each of the LD and TD. In order to further improve the precision of shape and dimension of products manufactured by bending the sheet materials of copper alloys, the ratio R/t is preferably 0, i.e., no cracks preferably appear, as the evaluation of the bending workability after notching in the LD. Furthermore, the bending workability in the LD is the bending workability evaluated by a test piece which is so cut that the LD is the longitudinal direction (it is the same in the case of the bending workability after notching), and the bending axis in the test is the TD. Similarly, the bending workability in the TD is the bending workability evaluated by a test piece which is so cut that the TD is the longitudinal direction, and the bending axis in the test is the LD.

When the sheet materials of copper alloys are used as the materials of connectors for automobiles, the stress relaxation resistance in the TD is particularly important, so that the stress relaxation resistance is preferably evaluated by a stress relaxation rate using a test piece which is so cut that the TD is the longitudinal direction. The stress relaxation rate of the sheet material of the copper alloy is preferably 5% or less, and more preferably 3% or less, when the sheet material is held at 200° C. for 1000 hours, as a method for evaluating the stress relaxation resistance.

[Producing Method]

The above-described sheet material of the copper alloy can be produced by the preferred embodiment of a sheet material of a copper alloy according to the present invention. The preferred embodiment of a sheet material of a copper alloy according to the present invention comprises: a melting and casting step of melting and casting the raw materials of a copper alloy having the above-described composition; a hot rolling step of carrying out an initial rolling pass in a temperature range of from 950° C. to 700° C. and carrying out a hot rolling operation at a rolling reduction of not less than 30% in a temperature range of from less than 700° C. to 500° C. to form a plate of the copper alloy, after the melting and casting step; a first cold rolling step of carrying out a cold rolling operation at a rolling reduction of not less than 85%, after the hot rolling step; a solution treatment step of carrying out a solution treatment which holds the plate of the copper alloy at a temperature of 750 to 1000° C. for 5 seconds to 5 minutes, after the first cold rolling step; a second cold rolling step of carrying out a cold rolling operation at a rolling reduction of 0 to 50%, after the solution treatment step; an ageing treatment step of carrying out an ageing treatment at a temperature of 300 to 550° C., after the second cold rolling step; a finish cold rolling step of carrying out a finish cold rolling operation at a rolling reduction of 0 to 30%, after the ageing treatment step; and optionally, a low temperature annealing step of carrying out a low temperature annealing operation at a temperature of 150 to 450° C., after the finish cold rolling step. These steps will be described below in detail. Furthermore, facing, pickling and so forth may be optionally carried out after the hot rolling. After each heat treatment, pickling, polishing, degreasing and so forth may be optionally carried out.

(Melting and Casting)

After the raw materials of a copper alloy are melted, an ingot is produced by the continuous casting, semi-continuous casting or the like. Furthermore, in order to prevent oxidation of Ti, the raw materials are preferably melted in an atmosphere of an inert gas or in a vacuum melting furnace. After casting, soaking (or hot forging) may be optionally carried out.

(Hot Rolling)

The hot rolling for Cu—Ti alloys is usually carried out at a high temperature of not lower than 700° C., preferably not lower than 750° C., so as to prevent deposits from being produced during rolling, and then, quenching is carried out after the hot rolling is completed. However, on such typical hot rolling conditions, it is difficult to produce a sheet material of a copper alloy having a uniform crystal grain structure and a specific texture as a sheet material of a copper alloy according to the present invention. That is, on such typical hot rolling conditions, it is difficult to produce a sheet material of a copper alloy which has uniform crystal grains having a coefficient of variation of CV<0.45 and which has a principal orientation component of {420}, even if the conditions in the subsequent steps are widely changed. For that reason, in the preferred embodiment of a method for producing a sheet material of a copper alloy according to the present invention, the initial rolling pass is carried out in a temperature range of from 950° C. to 700° C., and hot rolling is carried out at a rolling reduction of not less than 30% in a temperature range of from less than 700° C. to 500° C.

When the hot rolling of the ingot is carried out, if the initial rolling pass is carried out in a high temperature range of not lower than 700° C. at which recrystallization is easy to occur, it is possible to break the cast structure to uniform components and structures. However, if the temperature exceeds 950° C., it is required to set such a temperature range that cracks are not produced in portions, such as segregation portions of alloy components, at which the melting point is lowered. Therefore, in order to ensure the complete recrystallization during the hot rolling steps, the hot rolling operation is preferably carried out at a rolling reduction of not less than 60% in a temperature range of from 950° C. to 700° C. Thus, the uniformity of the structure is further promoted. Furthermore, since it is required to apply a great rolling load in order to obtain a rolling reduction of not less than 60% by one pass, the total rolling reduction of not less than 60% may be ensured by a plurality of passes. In the preferred embodiment of a method for producing a sheet material of a copper alloy according to the present invention, the rolling reduction of not less than 30% is ensured in a temperature range of from not less than 700° C. to 500° C., at which rolling strains are easily produced, at the hot rolling step. Thus, part of deposits are generated, and the cold rolling and solution treatment at the subsequent steps are combined with the hot rolling, so that it is easy to form a crystal grain structure having uniform crystal grain sizes and a recrystallized texture having a principal orientation component of {420}. Furthermore, in this case, the hot rolling operation in a temperature range of from less than 700° C. to 500° C. may be carried by a plurality of passes. The rolling reduction in this temperature range is preferably not less than 40%. The final pass temperature at the hot rolling step is preferably not higher than 600° C. The total rolling reduction at the hot rolling step may be about 80 to 97%.

The rolling reduction $\epsilon$ (%) in a certain temperature range is calculated by $\epsilon = (t_0 - t_1) \times 100 / t_0$, assuming that the thickness of a plate before the initial rolling pass of a plurality of rolling passes, which are continuously carried out in the temperature range, is $t_0$ (mm) and that the thickness of the plate after the final rolling pass of the plurality of rolling passes is $t_1$ (mm). For example, the thickness of a plate before the initial rolling pass is 120 mm, and a hot rolling operation is carried out in a temperature range of not lower than 700° C., so that the thickness of the plate after the final rolling pass at a temperature of not lower than 700° C. is 30 mm. Then, the hot rolling operation is subsequently carried out, and the final pass of the hot rolling operation is carried out in a temperature range of from less than 700° C. to 400° C., so that a plate of the copper alloy having a thickness of 10 mm is finally obtained. In this case, the rolling reduction in the temperature range of not less than 700° C. is (120−30)×100/120=75(%), and the rolling reduction in the temperature range of less than 700° C. to 400° C. is (30−10)×100/30=66.7(%), so that the total rolling reduction in the hot rolling operation is (120−10)×100/120=91.7(%).

(First Cold Rolling)

At the cold rolling step carried out before the solution treatment, the rolling reduction is required to be not less than 85%, and preferably not less than 90%. If the material worked at such a high rolling reduction is subjected to a solution treatment at the subsequent step, strains introduced at the high rolling reduction serve as nucleuses for recrystallization. Thus, it is possible to obtain a crystal grain structure having uniform crystal grain sizes, and it is possible to form a recrystallized texture having a principal orientation component of {420}. In particular, the recrystallized texture greatly depends on the cold-rolling reduction before recrystallization. Specifically, the crystal orientation having a principal orientation component of {420} is hardly generated at a cold-rolling reduction of not higher than 60%, and is gradually increased at a cold-rolling reduction of 60 to 80% as the cold-rolling reduction is increased, the crystal orientation being rapidly increased if the cold-rolling reduction exceeds about 85%. In order to obtain a crystal orientation wherein the orientation of {420} is sufficiently superior, the rolling reduction is required to be not less than 85%, and preferably not less than 90%. Furthermore, it is not particularly required to define the upper limit of the cold-rolling reduction since it is necessarily limited by mill power and so forth. However, it is possible to obtain good results at a cold-rolling reduction of not higher than 99% in order to prevent cracks from being produced in edges.

Furthermore, in usual methods for producing a sheet material of a copper alloy, one or a plurality of cold rolling operations before and after an process annealing (intermediate solution treatment) are carried out before a solution treatment after a hot rolling operation. However, if such cold rolling operations are carried out, the cold-rolling reduction immediately before the solution treatment is lowered to increase the coefficient of variation in grain size of crystal grain structure formed by the solution treatment, and the recrystallized texture having a principal orientation component of {420} is remarkably weaken. Therefore, such cold rolling operations are not carried out in the preferred embodiment of a method for producing a sheet material of a copper alloy according to the present invention.

(Solution Treatment)

In usual methods for producing a sheet material of a copper alloy, the solution treatment is carried out in order to form a solid solution of solute atoms into a matrix again and to carry out recrystallization. In the preferred embodiment of a method for producing a sheet material of a copper alloy according to the present invention, the solution treatment is also carried out in order to form a recrystallized texture having a principal orientation component of {420}. It is required to carry out the solution treatment at a higher temperature than the solid solubility curve of a copper alloy having a chemical composition (a solid solubility curve defined by an equilibrium diagram) by 30° C. or more. If the temperature is too low, it is not possible to sufficiently form the solid solution of beta phases. On the other hand, if the temperature is too high, crystal grains are coarsened. In either case, it is difficult to finally obtain a sheet material of a copper alloy having an excellent bending workability and a high strength. For that reason, the solution treatment is preferably carried out in a temperature range which is higher than the solid solubility curve by 50 to 100° C.

In the solution treatment, a holding time in a heating furnace in a temperature range of from 750° C. to 1000° C. is preferably set to carry out a heat treatment so that the mean grain size of recrystallized grains (twin boundaries are not regarded as crystal grain boundaries) is in the range of from 5 μm to 25 μm, preferably in the range of from 8 μm to 20 μm. If the grain size of recrystallized grains is too small, the recrystallized texture having a principal orientation component of {420} is weak, and this is disadvantageous in order to improve the stress relaxation resistance. On the other hand, if the grain size of recrystallized grains is too large, the surface of the bent portion of the sheet material of the copper alloy is easy to be rough. Furthermore, the grain size of recrystallized grains is varied by the cold-rolling reduction before the solution treatment and by chemical composition. However, if the relationship between the heat pattern in the solution treatment and the mean grain size is previously derived by experiments with respect to the respective alloys, it is possible to set the holding time in the temperature range of from 750° C. to 1000° C. Specifically, in the chemical composition of a sheet material of a copper alloy according to the present invention, appropriate heating conditions can be set on heating conditions for holding the plate at a temperature of 750 to 1000° C. for 5 seconds to 5 minutes.

(Second Cold Rolling)

Then, a cold rolling operation is carried out at a rolling reduction of 0 to 50%. The cold rolling at this stage has the function of promoting deposition in the subsequent ageing treatment. Thus, it is possible to lower the ageing temperature for providing necessary characteristics, such as electric conductivity and hardness, or it is possible to shorten the ageing time.

The texture having a principal orientation component of {220} is developed by the cold rolling operation. However, crystal grains, which have the {420} plane parallel to the surface of the sheet material, sufficiently remain in the cold-rolling reduction of not higher than 50%. The cold rolling operation at this stage is required to be carried out at a rolling reduction of not higher than 50%, and is preferably carried out at a rolling reduction of 0 to 40%. If the rolling reduction is too high, it is difficult to obtain an ideal crystal orientation satisfying I{420}/I$_0${420}>1.0. Furthermore, the rolling reduction of 0% means that the ageing treatment is directly carried out without carrying out the second cold rolling after the solution treatment. In the preferred embodiment of a method for producing a sheet material of a copper alloy according to the present invention, the second cold rolling step may be omitted in order to improve the productivity of the sheet material of the copper alloy.

(Ageing Treatment)

At the ageing treatment step, the ageing temperature is set so as not to be too high on effective conditions for improving the electric conductivity and strength of the sheet material of the copper alloy. If the ageing temperature is too high, the crystal orientation having a preferred orientation of {420} developed by the solution treatment is weakened, so that there are some cases where it is not possible to obtain the function of sufficiently improving the bending workability of the sheet material of the copper alloy. Specifically, the ageing temperature is preferably set so that the temperature of the sheet material is in the range of from 300° C. to 550° C. The ageing temperature is more preferably set so that the temperature of the sheet material is in the range of from 350° C. to 500° C. The ageing time can be set in the range of from about 60 minutes to about 600 minutes. The ageing treatment may be carried out in an atmosphere of hydrogen, nitrogen or argon in order to inhibit oxide films from being formed on the surface of the sheet material during the ageing treatment.

In Cu—Ti alloys, stable phases (beta phases) are preferably inhibited from being generated. For that reason, assuming that the ageing temperature capable of obtaining the maximum hardness in the composition of the Cu—Ti alloy is $T_M$ (° C.) and that the maximum hardness thereof is $H_M$ (HV), the ageing temperature at the ageing treatment step is preferably set to be a temperature which ranges from 300° C. to 550° C. and which is $T_M \pm 10$° C., and the ageing time is preferably set so that the hardness of the sheet material is in the range of from 0.90 $H_M$ to 0.95 $H_M$. The ageing temperature $T_M$ (° C.) capable of obtaining the maximum hardness, and the maximum hardness $H_M$ (HV) can be previously grasped by pretests. In the composition range of a sheet material of a copper alloy according to the present invention, the hardness of the sheet material usually reaches the maximum hardness in an ageing time of 24 hours or less.

Furthermore, if the requirement for the strength level is not so high (e.g., if the 0.2% yield strength is about 900 MPa), the finish cold rolling step and low temperature annealing step, which will be described later, may be omitted.

(Finish Cold Rolling)

The finish cold rolling has the function of highly improving the strength level (particularly 0.2% yield strength) of the sheet material of the copper alloy. If the finish cold-rolling reduction is too low, there is some possibility that a sufficient strength can not be obtained. However, as the rolling reduction is increased, the rolling texture having a principal orientation component of {220} is developed. On the other hand, if the finish cold-rolling reduction is too high, the rolling texture having a principal orientation component of {220} is too superior to other orientations, so that it is not possible to realize a crystal orientation having both of a high strength and an excellent bending workability in the bad way. In the preferred embodiment of a method for producing a sheet material of a copper alloy according to the present invention, the finish cold-rolling reduction is preferably in the range of from 0% to 30%, and more preferably in the range of 10% to 20%. By this finish cold rolling, it is possible to maintain the crystal orientation satisfying I{420}/I$_0${420}>1.0. Furthermore, the rolling reduction of 0% means that this cold rolling is not carried out.

The final thickness of the sheet material is preferably in the range of from about 0.05 mm to about 0.1 mm, and more preferably in the range of from 0.08 mm to 0.5 mm.

(Low Temperature Annealing)

After the finish cold rolling, the low temperature annealing may be carried out in order to reduce the residual stress of the sheet material of the copper alloy, to improve the bending workability of the sheet material, and to improve the stress relaxation resistance of the sheet material due to the decrease of dislocation in vacancies and on the slip plane. In particular, Cu—Ti alloys are hardened by a low temperature annealing in an appropriate temperature range. The heating temperature in this low temperature annealing is preferably set so that the temperature of the sheet material is in the range of from 150° C. to 450° C. By this low temperature annealing, it is possible to improve all of the strength, electric conductivity, bending workability and stress relaxation resistance of the sheet material of the copper alloy. If the heating temperature is too high, the sheet material of the copper alloy is softened in a short time, so that variations in characteristics are easily caused in either of batch and continuous systems. On the other hand, if the heating temperature is too low, it is not possible to sufficiently obtain the above-described functions of improving the characteristics. The holding time in the above-described temperature range is preferably not less than 5 seconds, and good results can be usually obtained when the holding time is not longer than 1 hour.

The examples of sheet materials of copper alloys and methods for producing the same according to the present invention will be described below in detail.

Examples 1-12

There were melted a copper alloy containing 3.18 wt % of Ti and the balance being Cu (Example 1), a copper alloy containing 4.08 wt % of Ti and the balance being Cu (Example 2), a copper alloy containing 3.58 wt % of Ti and the balance being Cu (Example 3), a copper alloy containing 4.64 wt % of Ti and the balance being Cu (Example 4), a copper alloy containing 2.86 wt % of Ti, 0.12 wt % of Co, 0.22 wt % of Ni and the balance being Cu (Example 5), 2.32 wt % of Ti, 0.14 wt % of Fe, 0.11 wt % of Sn, 0.36 wt % of Zn and the balance being Cu (Example 6), a copper alloy containing 1.93 wt % of Ti, 0.54 wt % of Ni, 0.08 wt % of Sn, 0.10 wt % of Mg, 0.11 wt % of Zr and the balance being Cu (Example 7), a copper alloy containing 1.55 wt % of Ti, 0.12 wt % of Ni, 0.21 wt % of Cr, 0.03 wt % of B and the balance being Cu (Example 8), a copper alloy containing 3.20 wt % of Ti, 0.14 wt % of Al, 0.03 wt % of P and the balance being Cu (Example 9), a copper alloy containing 3.06 wt % of Ti, 0.12 wt % of V, 0.06 wt % of Mn and the balance being Cu (Example 10), a copper alloy containing 3.14 wt % of Ti, 0.12 wt % of Ag, 0.06 wt % of Be and the balance being Cu (Example 11), and a copper alloy containing 3.35 wt % of Ti, 0.24 wt % of misch metal and the balance being Cu (Example 12), respectively. Then, a vertical semi-continuous casting machine was used for casting the melted copper alloys to obtain ingots having a thickness of 60 mm, respectively.

Each of the ingots was heated to 950° C., and then, extracted to start hot rolling. The pass schedule in the hot rolling was set so that the rolling reduction in a temperature range of not lower than 750° C. was not less than 60% while rolling was carried out even in a temperature range of lower than 700° C. Furthermore, the hot-rolling reductions in the temperature range of from less than 700° C. to 500° C. were 42% (Example 1), 35% (Example 2), 32% (Example 3), 30% (Example 4), 50% (Example 5), 57% (Example 6), 50% (Example 7), 55% (Example 8), 45% (Example 9), 40% (Example 10), 40% (Example 11) and 40% (Example 12), respectively, and the final pass temperature in the hot rolling was a temperature of 600 to 500° C. The total hot-rolling reduction from the ingot was about 95%. After the hot rolling, the surface oxide layer was removed (faced) by mechanical polishing.

Then, cold rolling was carried out at rolling reductions of 98% (Example 1), 92% (Example 2), 95% (Example 3), 90% (Example 4), 90% (Example 5), 96% (Example 6), 98% (Example 7), 96% (Example 8), 96% (Example 9), 95% (Example 10), 86% (Example 11) and 92% (Example 12) to form plates of the copper alloys, respectively, and then, a solution treatment was carried out. In this solution treatment, a heat treatment was carried out at a heating temperature, which was set to be a higher temperature than the solid solubility curve of the composition of each alloy by 30° C. or more in a temperature range of from 750° C. to 1000° C., for a holding time, which was set to be in the range of from 5 seconds to 5 minutes, so that the mean crystal grain size after the solution treatment in each example (twin boundaries were not regarded as crystal grain boundaries) was in the range of from 5 μm to 25 μm. Specifically, the heat treatment was carried out at 900° C. for 15 seconds (Example 1), at 950° C. for 15 seconds (Example 2), at 900° C. for 25 seconds (Example 3), at 1000° C. for 15 seconds (Example 4), at 850° C. for 20 seconds (Example 5), at 850° C. for 15 seconds (Example 6), at 830° C. for 15 seconds (Example 7), at 850° C. for seconds (Example 8), at 900° C. for 18 seconds (Example 9), at 900° C. for 20 seconds (Example 10), at 900° C. for 25 seconds (Example 11) and at 900° C. for 20 seconds (Example 12), respectively.

Then, the plates after the solution treatment were cold-rolled at rolling reductions of 15% (Example 1), 20% (Example 2), 0% (Example 3), 25% (Example 4), 15% (Example 5), 45% (Example 6), 20% (Example 7), 20% (Example 8), 15% (Example 9), 0% (Example 10), 0% (Example 11) and 0% (Example 12), respectively.

With respect to the plates thus obtained, ageing treatment experiments up to 24 hours were carried out in a temperature range of from 300° C. to 500° C. as pretests to grasp ageing conditions (ageing temperature $T_M$ (° C.), ageing time $t_M$ (min), maximum hardness $H_M$ (HV)) on which the maximum hardness was obtained in accordance with the compositions of the alloys. Then, the ageing temperature was set to be in the range of $T_M \pm 10°$ C., and the ageing time was set to be a period of time which was shorter than $t_M$ and which causes the hardness of the plate after ageing to be in the range of from 0.90 $H_M$ to 0.95 $H_M$.

Then, the plates after the ageing treatment were finish cold-rolled at rolling reductions of 10% (Example 1), 0% (Example 2), 12% (Example 3), 0% (Example 4), 15% (Example 5), 0% (Example 6), 25% (Example 7), 30% (Example 8), 15% (Example 9), 25% (Example 10), 10% (Example 11) and 15% (Example 12), respectively. Then, a low temperature annealing for holding each plate in an annealing furnace at 450° C. for one minute was carried out.

The sheet materials of the copper alloys were thus obtained in Examples 1-12. Furthermore, facing was optionally carried out in the middle of the production of the sheet materials so that the thickness of each sheet material was 0.15 mm.

Then, samples were cut out from the sheet materials of copper alloys obtained in these examples, to derive the mean crystal grain size of crystal grain structure, (maximum crystal grain size−minimum crystal grain size)/(mean crystal grain size), intensity of X-ray diffraction, electric conductivity, tensile strength, 0.2% yield strength, usual bending workability, bending workability after notching, stress relaxation resistance of each sheet material as follows.

The mean crystal grain size of crystal grain structure was calculated as follows. First, the surface (rolled surface) of the sheet material of the copper alloy was polished and etched. Then, from the optical microphotograph of the rolled surface of the sheet material of the copper alloy, ten square visual fields having a size of 100 µm×100 µm were selected at random, two sides of each of the visual fields being parallel to the rolling direction (LD) and the other two sides of each of the visual fields being parallel to a direction (TD) perpendicular to the rolling direction. In each of the visual fields, crystal grain sizes were measured by the method of section based on JIS H0501. Then, the mean values $d_1$, $d_2$, . . . , $d_{10}$ of the crystal grain sizes in each of the visual fields were calculated, respectively. Then, the mean value $d_{mean}$ $(=(d_1+d_2+ \ldots +d_{10})/10)$ of the mean values $d_1$, $d_2$, . . . , $d_{10}$ of the crystal grain sizes was calculated as the mean crystal grain size of crystal grain structure. Furthermore, crystal grains extend in the rolling direction by rolling after the solution treatment. However, after the sheet material is rolled after the solution treatment, the length of crystal grains in the direction (TD) perpendicular to the rolling direction is substantially equal to the length of crystal grains in the TD after the solution treatment. Therefore, the measurement of crystal grain sizes was carried out by measuring the length of crystal grains in the direction (TD) perpendicular to the rolling direction. As a result, the mean crystal grain sizes were 8 µm (Example 1), 12 µm (Example 2), 16 µm (Example 3), 6 µm (Example 4), 18 µm (Example 5), 15 µm (Example 6), 10 µm (Example 7), 14 µm (Example 8), 11 µm (Example 9), 12 µm (Example 10), 16 µm (Example 11) and 12 µm (Example 12), respectively.

In addition, (maximum crystal grain size−minimum crystal grain size)/(mean crystal grain size) was calculated as $(d_{max}-d_{min})/d_{mean}$, assuming that the maximum value of the mean values $d_1$, $d_2$, . . . , $d_{10}$ of crystal grain sizes in each of the visual fields was the maximum crystal grain size $d_{max}$ and that the minimum value thereof was the minimum crystal grain size $d_{min}$. As a result, the values of (maximum crystal grain size−minimum crystal grain size)/(mean crystal grain size) were 0.06 (Example 1), 0.08 (Example 2), 0.09 (Example 3), 0.12 (Example 4), 0.08 (Example 5), 0.05 (Example 6), 0.07 (Example 7), 0.10 (Example 8), 0.14 (Example 9), 0.11 (Example 10), 0.09 (Example 11) and 0.06 (Example 12), respectively.

The measurement of the intensity of X-ray diffraction (the integrated intensity of X-ray diffraction) was carried out as follows. First, samples were prepared by finish polishing the surface (rolled surface) of the sheet material of the copper alloy with a #1500 waterproof paper. Then, with respect to the finished surface of each sample, the intensity I{420} of X-ray diffraction on the {420} plane and the intensity I{220} of X-ray diffraction on the {220} plane were measured by means of an X-ray diffractometer (XRD) on the measuring conditions which contain Mo-Kα rays, an X-ray tube voltage of 40 kV and an X-ray tube current of 30 mA. On the other hand, with respect to the standard powder of pure copper, the intensity $I_0${420} of X-ray diffraction on the {420} plane and the intensity $I_0${220} on the {220} plane were also measured by means of the same X-ray diffractometer on the same measuring conditions. Using these measured values, the ratio I{420}/$I_0${420} of the intensities of X-ray diffraction, and the ratio I{220}/$I_0${220} of the intensities of X-ray diffraction were derived. As a result, I{420}/$I_0${420} and I{220}/$I_0${220} were 1.3 and 2.8 (Example 1), 1.6 and 2.6 (Example 2), 1.5 and 2.7 (Example 3), 2.0 and 2.6 (Example 4), 1.4 and 3.2 (Example 5), 2.0 and 2.6 (Example 6), 1.5 and 2.8 (Example 7), 1.4 and 2.6 (Example 8), 1.2 and 3.2 (Example 9), 1.1 and 3.6 (Example 10), 1.6 and 2.5 (Example 11), and 1.4 and 2.7 (Example 12), respectively.

The electric conductivity of the sheet material of the copper alloy was measured in accordance with the electric conductivity measuring method based on JIS H0505. As a result, the electric conductivities were 13.2% IACS (Example 1), 12.2% IACS (Example 2), 12.4% IACS (Example 3), 13.0% IACS (Example 4), 13.6% IACS (Example 5), 14.5% IACS (Example 6), 15.1% IACS (Example 7), 16.2% IACS (Example 8), 12.4% IACS (Example 9), 12.6% IACS (Example 10), 13.1% IACS (Example 11) and 12.8% IACS (Example 12), respectively.

In order to evaluate the tensile strength serving as one of mechanical characteristics of the sheet material of the copper alloy, three test pieces (No. 5 test pieces based on JIS Z2201) for tension test in the LD (rolling direction) were cut out from each of the sheet materials of copper alloys. Then, the tension test based on JIS Z2241 was carried out with respect to each of the test pieces to derive the mean value of tensile strengths in the LD and the mean value of 0.2% yield strengths. As a result, the tensile strength in the LD and the 0.2% yield strength were 1005 MPa and 935 MPa (Example 1), 1016 MPa and 915 MPa (Example 2), 976 MPa and 905 MPa (Example 3), 1025 MPa and 946 MPa (Example 4), 980 MPa and 912 MPa (Example 5), 986 MPa and 888 MPa (Example 6), 968 MPa and 892 MPa (Example 7), 976 MPa and 965 MPa (Example 8), 1025 MPa and 955 MPa (Example 9), 1036 MPa and 970 MPa (Example 10), 1025 MPa and 955 MPa (Example 11), and 1034 MPa and 967 MPa (Example 12), respectively.

In order to evaluate the stress relaxation resistance of the sheet material of the copper alloy, a bending test piece (width: 10 mm) having a longitudinal direction of TD (the direction perpendicular to the rolling direction and thickness direction) was cut out from the sheet material of the copper alloy. Then, the bending test piece was bent in the form of an arch so that the surface stress in the central portion of the test piece in the longitudinal direction thereof is 80% of the 0.2% yield strength, and then, the test piece was fixed in this state. Furthermore, the surface stress is defined by surface stress (MPa)=6Et $\delta/L_0^2$ wherein E denotes the modulus of elasticity (MPa), and t denotes the thickness (mm) of the sample, δ denoting the deflection height (mm) of the sample. From the bending deformation after the test piece in this state was held at 200° C. for 1000 hours in the atmosphere, the stress relaxation rate was calculated by stress relaxation rate (%)=$(L_1-L_2)\times 100/(L_1-L_0)$ wherein $L_0$ denotes the length of a jig, i.e., the horizontal distance (mm) between both ends of the fixed sample during the test, and $L_1$ denotes the length (mm) of the sample when the test starts, $L_2$ denoting the horizontal distance (mm) between both ends of the sample after the test. As a result, the stress relaxation rates were 2.4% (Example 1), 2.2% (Example 2), 2.8% (Example 3), 3.1% (Example 4), 2.2% (Example 5), 3.4% (Example 6), 3.3% (Example 7), 3.4% (Example 8), 3.6% (Example 9), 3.3% (Example 10), 2.2% (Example 11) and 2.3% (Example 12), respectively. Furthermore, it was evaluated that the sheet material of the copper alloy having a stress relaxation rate of not higher than 5% has a high durability even if the sheet material is used as the material of connectors for automobiles, and it was judged that such a sheet material of the copper alloy was acceptable.

In order to evaluate the usual bending workability of the sheet material of the copper alloy, three bending test pieces (width: 10 mm) having a longitudinal direction of LD (rolling direction), and three bending test pieces (width: 10 mm) having a longitudinal direction of TD (the direction perpendicular to the rolling direction and thickness direction) were cut out from the sheet material of the copper alloy, respectively. Then, the 90° W bending test based on JIS H3110 was carried out with respect to each of the test pieces. Then, the surface and section of the bent portion of each test piece after the test were observed at a magnification of 100 by means of an optical microscope, to derive a minimum bending radius R at which cracks are not produced. Then, the minimum bending radius R was divided by the thickness t of the sheet material of the copper alloy, to derive the values of R/t in the LD and TD, respectively. The worst result of the values of R/t with respect to the three test pieces in each of the LD and TD was adopted as the value of R/t in the LD and TD, respectively. As a result, the values of R/t in the LD and TD were 0.0 and 0.5 (Examples 1, 4 and 11), 0.0 and 0.0 (Examples 2, 3, 6, 7 and 8), 0.0 and 0.3 (Example 5), 0.0 and 0.7 (Example 9 and 12), and 0.0 and 0.8 (Example 10), respectively.

Figure 2:
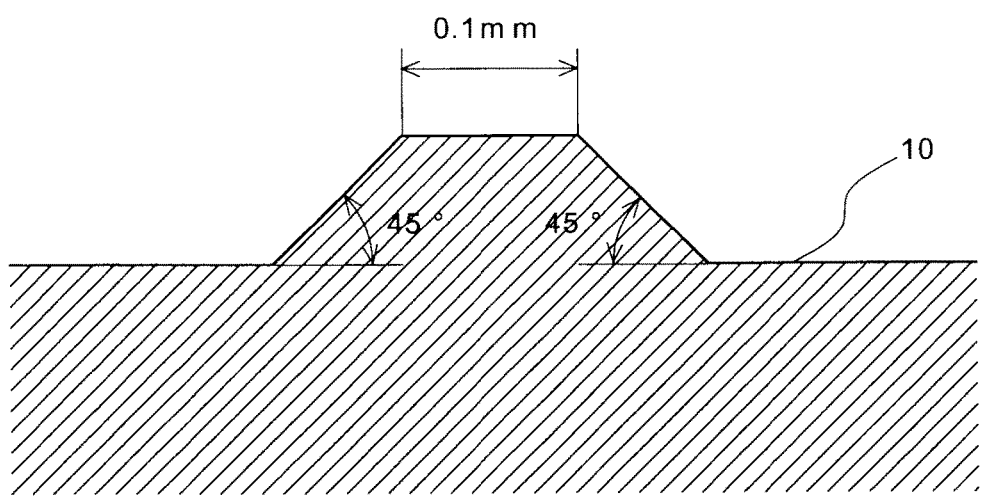
FIG. 2 is a sectional view schematically showing the section of a jig for forming a notch.
Figure 3:
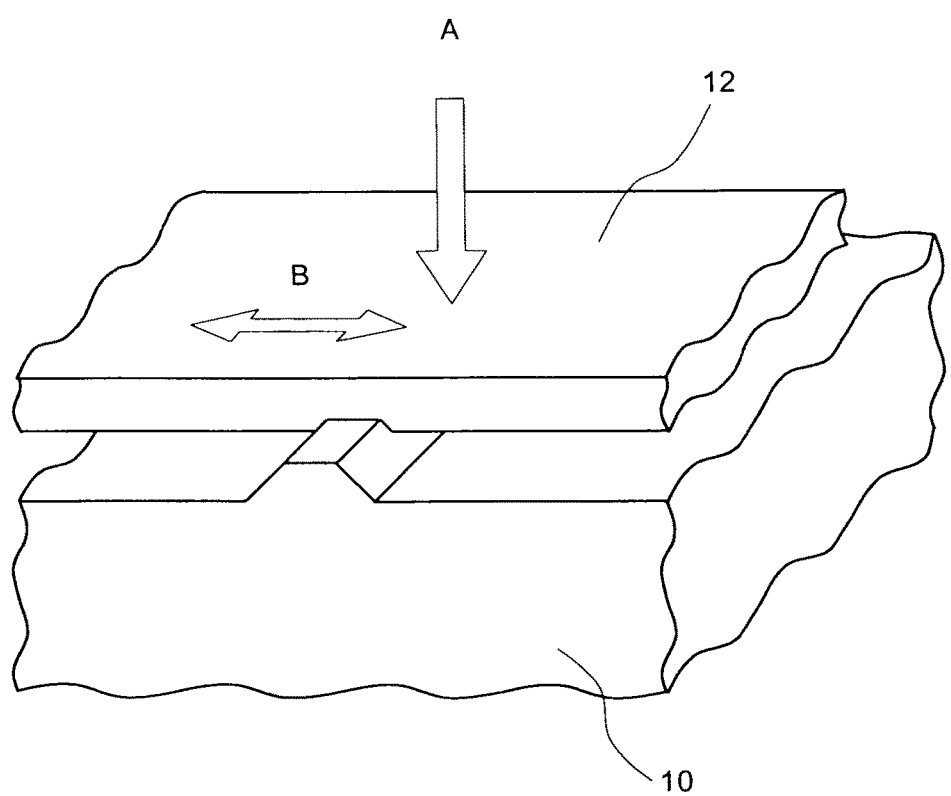
FIG. 3 is a perspective view for explaining a notching method.
Figure 4:
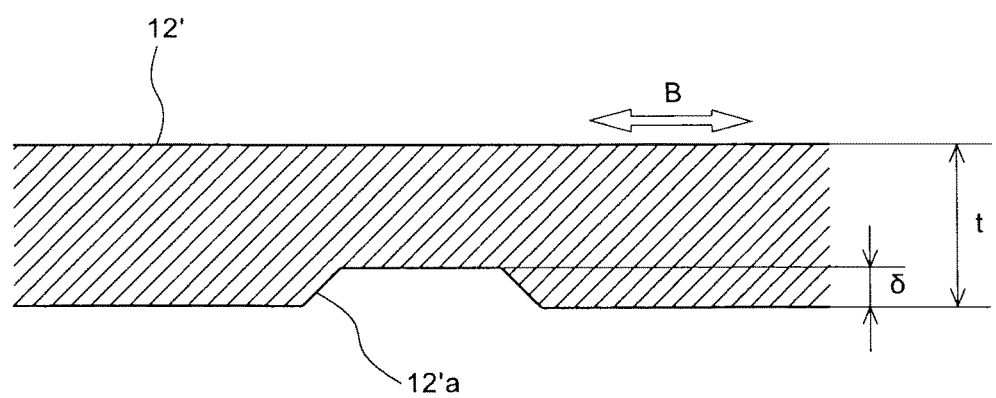
FIG. 4 is a sectional view schematically showing the section of portions near a notch forming portion of a notched bending test piece.
Figure 5A:
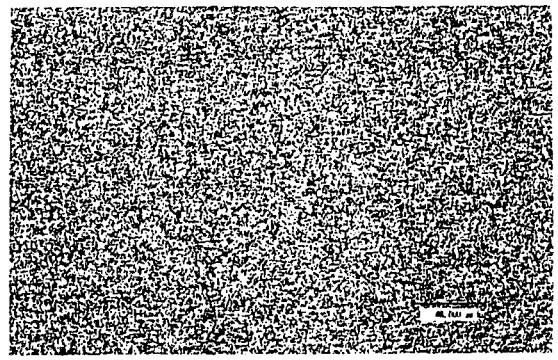
FIG. 5A is an optical microphotograph showing the structure of the surface of a sheet material of a copper alloy before a solution treatment in Example 1.
Figure 5B:
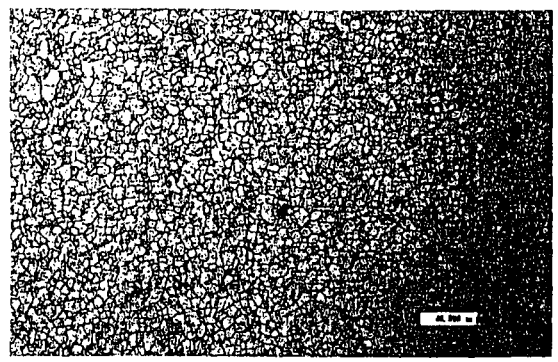
FIG. 5B is an optical microphotograph showing the structure of the surface of the sheet material of the copper alloy after the solution treatment at 850° C. for 10 seconds in Example 1.
Figure 5C:
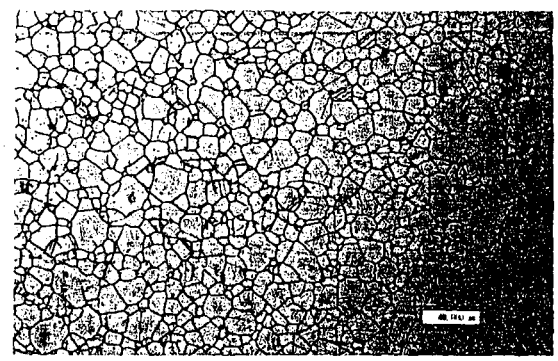
FIG. 5C is an optical microphotograph showing the structure of the surface of the sheet material of the copper alloy after the solution treatment at 850° C. for 30 seconds in Example 1.
Figure 5D:
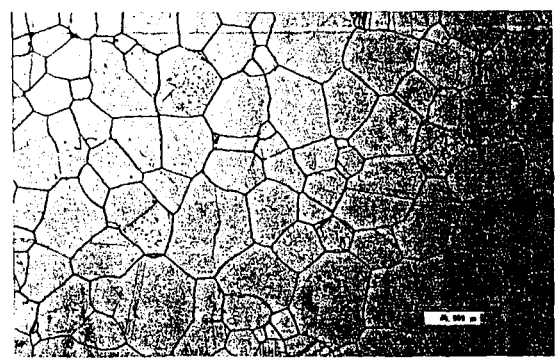
FIG. 5D is an optical microphotograph showing the structure of the surface of the sheet material of the copper alloy after the solution treatment at 850° C. for 60 seconds in Example 1.
Figure 6A:
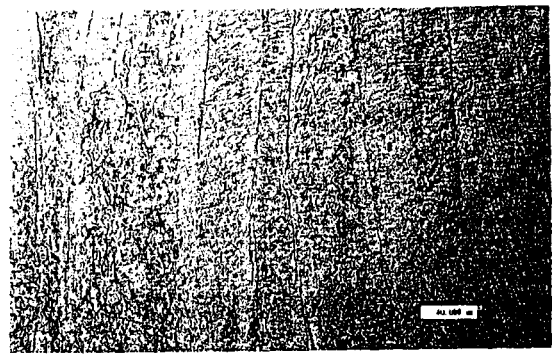
FIG. 6A is an optical microphotograph showing the structure of the surface of a sheet material of a copper alloy before a solution treatment in Comparative Example 1.
Figure 6B:
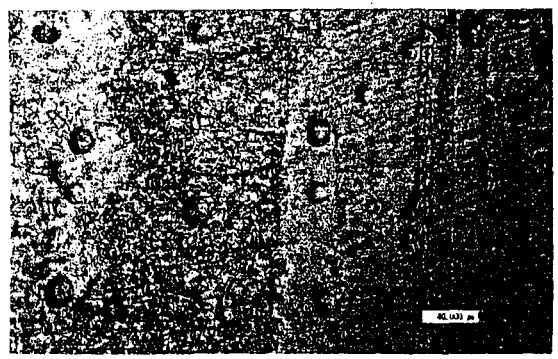
FIG. 6B is an optical microphotograph showing the structure of the surface of the sheet material of the copper alloy after the solution treatment at 850° C. for 10 seconds in Comparative Example 1.
Figure 6C:
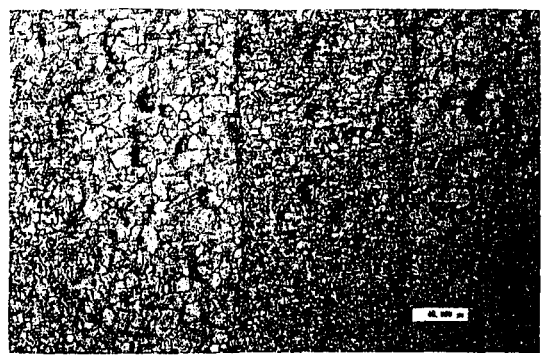
FIG. 6C is an optical microphotograph showing the structure of the surface of the sheet material of the copper alloy after the solution treatment at 850° C. for 30 seconds in Comparative Example 1.
Figure 6D:
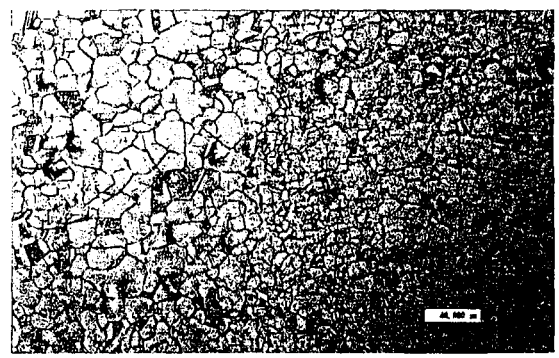
FIG. 6D is an optical microphotograph showing the structure of the surface of the sheet material of the copper alloy after the solution treatment at 850° C. for 60 seconds in Comparative Example 1.

In order to evaluate the bending workability after notching of the sheet material of the copper alloy, a strip sample (width: 10 mm) having a longitudinal direction of LD was cut out from the sheet material of the copper alloy. Then, a notch extending over the whole width of a sample 12 was formed by applying a load of 20 kN to the sample 12 in the direction of arrow A as shown in FIG. 3, using a notch forming jig 10 wherein a protruding portion having a substantially trapezoid section is formed on the top surface thereof (the width of the flat top surface of the protruding portion is 0.1 mm, and the angle between each side of the protruding portion and the flat surface is 45°) as shown in FIGS. 2 and 3. Furthermore, the longitudinal direction of the notch (i.e., the direction parallel to the groove) was a direction perpendicular to the longitudinal direction (the direction of arrow B) of the sample. The depth of the notch 12'*a* of each of three notched bending test pieces 12' thus prepared was measured. The depth δ of the notch 12'*a* schematically shown in FIG. 4 was about ¼ to about ⅙ as much as the thickness t of the sample. With respect to each of the three notched bending test pieces 12', the 90° W bending test based on JIS H3110 was carried out. The 90° W bending test was carried out by means of a jig wherein R of the tip of the central protruding portion of the lower die was 0 mm. In this 90° W bending test, the notched bending test piece 12' was so set that the notch forming surface faces downward while the central protruding portion of the lower die corresponds to the notch portion. Then, the surface and section of the bent portion of each of the three test pieces after the test were observed at a magnification of 100 by means of an optical microscope, to determine the presence of cracks. The worst result of the test pieces was adopted to evaluate the bending workability of the bent portion after notching. As a result, in all of the examples, cracks are not observed on the surface and section of the bent portion after notching, so that the bending workability after notching was good.

Comparative Example 1

A copper alloy having the same composition as that in Example 1 was used for obtaining a sheet material of the copper alloy by the same method as that in Example 1, except that the hot-rolling reduction in the temperature range of less than 700° C. to 500° C. was 20% and that a plurality of cold rolling operations before and after the process annealing (intermediate solution treatment) at 850° C. for 120 seconds were carried out during the cold rolling before the solution treatment. Furthermore, a heat treatment was carried out at 800° C. for 150 seconds in the solution treatment.

Samples were cut out from the sheet material of the copper alloy thus obtained, to derive the mean crystal grain size of crystal grain structure, (maximum crystal grain size–minimum crystal grain size)/(mean crystal grain size), intensity of X-ray diffraction, electric conductivity, tensile strength, 0.2% yield strength, usual bending workability, bending workability after notching, and stress relaxation resistance thereof by the same methods as those in Examples 1-12.

As a result, the mean crystal grain size was 5 μm, and (maximum crystal grain size–minimum crystal grain size)/ (mean crystal grain size) was 0.42. The ratios $I\{420\}/I_o\{420\}$ and $I\{220\}/I_o\{220\}$ of the intensities of X-ray diffraction were 0.6 and 4.4, respectively. The electric conductivity was 13.3% IACS. The tensile strength in the LD and the 0.2% yield strength were MPa and 928 MPa, respectively. The stress relaxation rate was 4.2%. As the evaluation of the usual bending workability, the values of R/t in the LD and TD were 2.0 and 3.0, respectively. The sample was broken at the bent portion after notching.

Comparative Example 2

A copper alloy having the same composition as that in Example 2 was used for obtaining a sheet material of the copper alloy by the same method as that in Example 2, except that the hot-rolling reduction in the temperature range of less than 700° C. to 500° C. was 25% and that a plurality of cold rolling operations before and after the process annealing (intermediate solution treatment) at 850° C. for 120 seconds were carried out during the cold rolling before the solution treatment. Furthermore, a heat treatment was carried out at 950° C. for 15 seconds in the solution treatment.

Samples were cut out from the sheet material of the copper alloy thus obtained, to derive the mean crystal grain size of crystal grain structure, (maximum crystal grain size–minimum crystal grain size)/(mean crystal grain size), intensity of X-ray diffraction, electric conductivity, tensile strength, 0.2% yield strength, usual bending workability, bending workability after notching, and stress relaxation resistance thereof by the same methods as those in Examples 1-12.

As a result, the mean crystal grain size was 12 μm, and (maximum crystal grain size–minimum crystal grain size)/ (mean crystal grain size) was 0.36. The ratios $I\{420\}/I_o\{420\}$ and $I\{220\}/I_o\{220\}$ of the intensities of X-ray diffraction were 0.4 and 3.2, respectively. The electric conductivity was 12.6% IACS. The tensile strength in the LD and the 0.2% yield strength were 996 MPa and 906 MPa, respectively. The stress relaxation rate was 3.9%. As the evaluation of the usual bending workability, the values of R/t in the LD and TD were 1.0 and 2.5, respectively. The sample was broken at the bent portion after notching.

Comparative Example 3

A copper alloy having the same composition as that in Example 3 was used for obtaining a sheet material of the copper alloy by the same method as that in Example 3, except that the hot-rolling reduction in the temperature range of less than 700° C. to 500° C. was 0%, i.e., the hot-rolling completing temperature was not lower than 700° C., and that a plurality of cold rolling operations before and after the process annealing (intermediate solution treatment) at 850° C. for 120 seconds were carried out during the cold rolling before the solution treatment. Furthermore, a heat treatment was carried out at 850° C. for 120 seconds in the solution treatment.

Samples were cut out from the sheet material of the copper alloy thus obtained, to derive the mean crystal grain size of crystal grain structure, (maximum crystal grain size–minimum crystal grain size)/(mean crystal grain size), intensity of X-ray diffraction, electric conductivity, tensile strength, 0.2% yield strength, usual bending workability, bending workability after notching, and stress relaxation resistance thereof by the same methods as those in Examples 1-12.

As a result, the mean crystal grain size was 18 μm, and (maximum crystal grain size–minimum crystal grain size)/(mean crystal grain size) was 0.35. The ratios I{420}/I$_0${420} and I{220}/I$_0${220} of the intensities of X-ray diffraction were 0.3 and 4.1, respectively. The electric conductivity was 12.7% IACS. The tensile strength in the LD and the 0.2% yield strength were 963 MPa and 898 MPa, respectively. The stress relaxation rate was 4.2%. As the evaluation of the usual bending workability, the values of R/t in the LD and TD were 1.5 and 2.5, respectively. Cracks were observed on the surface and section of the bent portion after notching.

Comparative Example 4

A copper alloy having the same composition as that in Example 4 was used for obtaining a sheet material of the copper alloy by the same method as that in Example 4, except that the hot-rolling reduction in the temperature range of less than 700° C. to 500° C. was 0%, i.e., the hot-rolling completing temperature was not lower than 700° C., and that a plurality of cold rolling operations before and after the process annealing (intermediate solution treatment) at 850° C. for 120 seconds were carried out during the cold rolling before the solution treatment. Furthermore, a heat treatment was carried out at 950° C. for 15 seconds in the solution treatment.

Samples were cut out from the sheet material of the copper alloy thus obtained, to derive the mean crystal grain size of crystal grain structure, (maximum crystal grain size–minimum crystal grain size)/(mean crystal grain size), intensity of X-ray diffraction, electric conductivity, tensile strength, 0.2% yield strength, usual bending workability, bending workability after notching, and stress relaxation resistance thereof by the same methods as those in Examples 1-12.

As a result, the mean crystal grain size was 5 μm, and (maximum crystal grain size–minimum crystal grain size)/(mean crystal grain size) was 0.33. The ratios I{420}/I$_0${420} and I{220}/I$_0${220} of the intensities of X-ray diffraction were 0.7 and 3.8, respectively. The electric conductivity was 13.1% IACS. The tensile strength in the LD and the 0.2% yield strength were 1011 MPa and 952 MPa, respectively. The stress relaxation rate was 5.4%. As the evaluation of the usual bending workability, the values of R/t in the LD and TD were 2.0 and 3.5, respectively. Cracks were observed on the surface and section of the bent portion after notching.

Comparative Example 5

A copper alloy having the same composition as that in Example 5 was used for obtaining a sheet material of the copper alloy by the same method as that in Example 5, except that the hot-rolling reduction in the temperature range of less than 700° C. to 500° C. was 15%, that a plurality of cold rolling operations before and after the process annealing (intermediate solution treatment) at 850° C. for 120 seconds were carried out during the cold rolling before the solution treatment, and that the ageing time was so set that the hardness of the sheet material after ageing be 1.00 with respect to the maximum hardness after ageing. Furthermore, a heat treatment was carried out at 850° C. for 15 seconds in the solution treatment.

Samples were cut out from the sheet material of the copper alloy thus obtained, to derive the mean crystal grain size of crystal grain structure, (maximum crystal grain size–minimum crystal grain size)/(mean crystal grain size), intensity of X-ray diffraction, electric conductivity, tensile strength, 0.2% yield strength, usual bending workability, bending workability after notching, and stress relaxation resistance thereof by the same methods as those in Examples 1-12.

As a result, the mean crystal grain size was 3 μm, and (maximum crystal grain size–minimum crystal grain size)/(mean crystal grain size) was 0.28. The ratios I{420}/I$_0${420} and I{220}/I$_0${220} of the intensities of X-ray diffraction were 0.3 and 4.3, respectively. The electric conductivity was 14.1% IACS. The tensile strength in the LD and the 0.2% yield strength were 986 MPa and 908 MPa, respectively. The stress relaxation rate was 7.6%. As the evaluation of the usual bending workability, the values of R/t in the LD and TD were 2.0 and 5.0, respectively. The sample was broken at the bent portion after notching.

Comparative Example 6

A sheet material of a copper alloy was obtained by the same method as that in Examples 1-12, except that a copper alloy containing 1.08 wt % of Ti, 0.17 wt % of Mg, 0.20 wt % of Zr and the balance being Cu was used as the melted copper alloy, that the hot-rolling reduction in the temperature range of less than 700° C. to 500° C. was 45%, that the cold-rolling reduction before the solution treatment was 96%, that the cold-rolling reduction after the solution treatment was 50%, and that the finish cold-rolling reduction was 20%. Furthermore, a heat treatment was carried out at 750° C. for 20 seconds in the solution treatment.

Samples were cut out from the sheet material of the copper alloy thus obtained, to derive the mean crystal grain size of crystal grain structure, (maximum crystal grain size–minimum crystal grain size)/(mean crystal grain size), intensity of X-ray diffraction, electric conductivity, tensile strength, 0.2% yield strength, usual bending workability, bending workability after notching, and stress relaxation resistance thereof by the same methods as those in Examples 1-12.

As a result, the mean crystal grain size was 8 μm, and (maximum crystal grain size–minimum crystal grain size)/(mean crystal grain size) was 0.35. The ratios 1{420}/I$_0${420} and I{220}/I$_0${220} of the intensities of X-ray diffraction were 0.3 and 4.3, respectively. The electric conductivity was 22.5% IACS. The tensile strength in the LD and the 0.2% yield strength were 842 MPa and 768 MPa, respectively. The stress relaxation rate was 6.4%. As the evaluation of the usual bending workability, the values of R/t in the LD and TD were 1.0 and 2.5, respectively. Cracks were observed on the surface and section of the bent portion after notching.

Comparative Example 7

A sheet material of a copper alloy was obtained by the same method as that in Example 1, except that a copper alloy containing 5.22 wt % of Ti, 0.15 wt % of Ni, 0.15 wt % of Zn and the balance being Cu was used as the melted copper alloy. Since the content of Ti was too high in this comparative example to set appropriate solution treatment conditions, cracks were produced during production, so that it was not possible to produce any sheet material to be evaluated.

Comparative Example 8

A copper alloy having the same composition as that in Example 1 was used for obtaining a sheet material of the copper alloy by the same method as that in Example 1, except that the solution treatment time was a longer period of time of 10 minutes. Furthermore, a heat treatment was carried out at 900° C. in the solution treatment.

Samples were cut out from the sheet material of the copper alloy thus obtained, to derive the mean crystal grain size of crystal grain structure, (maximum crystal grain size−minimum crystal grain size)/(mean crystal grain size), intensity of X-ray diffraction, electric conductivity, tensile strength, 0.2% yield strength, usual bending workability, bending workability after notching, and stress relaxation resistance thereof by the same methods as those in Examples 1-12.

As a result, the mean crystal grain size was 62 μm, and (maximum crystal grain size−minimum crystal grain size)/(mean crystal grain size) was 0.06. The ratios $I\{420\}/I_0\{420\}$ and $I\{220\}/I_0\{220\}$ of the intensities of X-ray diffraction were 1.8 and 2.4, respectively. The electric conductivity was 12.7% IACS. The tensile strength in the LD and the 0.2% yield strength were 928 MPa and 856 MPa, respectively. The stress relaxation rate was 2.0%. As the evaluation of the usual bending workability, the values of R/t in the LD and TD were 2.0 and 2.5, respectively. Cracks were observed on the surface and section of the bent portion after notching.

Comparative Example 9

A copper alloy having the same composition as that in Example 1 was used for obtaining a sheet material of the copper alloy by the same method as that in Example 1, except that the solution treatment temperature was a lower temperature of 700° C. and that the solution treatment time was a longer period of time of 10 minutes.

Samples were cut out from the sheet material of the copper alloy thus obtained, to derive the mean crystal grain size of crystal grain structure, (maximum crystal grain size−minimum crystal grain size)/(mean crystal grain size), intensity of X-ray diffraction, electric conductivity, tensile strength, 0.2% yield strength, usual bending workability, bending workability after notching, and stress relaxation resistance thereof by the same methods as those in Examples 1-12.

As a result, the mean crystal grain size was 3 μm, and (maximum crystal grain size−minimum crystal grain size)/(mean crystal grain size) was 0.48. The ratios $I\{420\}/I_0\{420\}$ and $I\{220\}/I_0\{220\}$ of the intensities of X-ray diffraction were 0.2 and 6.1, respectively. The electric conductivity was 15.6% IACS. The tensile strength in the LD and the 0.2% yield strength were 1026 MPa and 945 MPa, respectively. The stress relaxation rate was 11.6%. As the evaluation of the usual bending workability, the value of R/t in the LD was 3.0, and the sample was broken even if the value of R/t in the TD was 5.0. The sample was broken at the bent portion after notching.

Comparative Example 10

A copper alloy having the same composition as that in Example 1 was used for obtaining a sheet material of the copper alloy by the same method as that in Example 1, except that the finish cold-rolling reduction was 55%. Furthermore, a heat treatment was carried out at 900° C. for 15 seconds in the solution treatment.

Samples were cut out from the sheet material of the copper alloy thus obtained, to derive the mean crystal grain size of crystal grain structure, (maximum crystal grain size−minimum crystal grain size)/(mean crystal grain size), intensity of X-ray diffraction, electric conductivity, tensile strength, 0.2% yield strength, usual bending workability, bending workability after notching, and stress relaxation resistance thereof by the same methods as those in Examples 1-12.

As a result, the mean crystal grain size was 8 μm, and (maximum crystal grain size−minimum crystal grain size)/(mean crystal grain size) was 0.06. The ratios $I\{420\}/I_0\{420\}$ and $I\{220\}/I_0\{220\}$ of the intensities of X-ray diffraction were 0.2 and 5.6, respectively. The electric conductivity was 12.4% IACS. The tensile strength in the LD and the 0.2% yield strength were 1114 MPa and 1056 MPa, respectively. The stress relaxation rate was 6.4%. As the evaluation of the usual bending workability, the sample was broken even if the value of R/t in each of the LD and TD was 5.0. The sample was broken at the bent portion after notching.

Comparative Example 11

A sheet material of a commercially-available typical Cu—Ti alloy (C199-1/2H, thickness: 0.15 mm) was prepared. Samples were cut out from the prepared sheet material of the copper alloy, to derive the mean crystal grain size of crystal grain structure, (maximum crystal grain size−minimum crystal grain size)/(mean crystal grain size), intensity of X-ray diffraction, electric conductivity, tensile strength, 0.2% yield strength, usual bending workability, bending workability after notching, and stress relaxation resistance thereof by the same methods as those in Examples 1-12.

As a result, the mean crystal grain size was 7 μm, and (maximum crystal grain size−minimum crystal grain size)/(mean crystal grain size) was 0.25. The ratios $I\{420\}/I_0\{420\}$ and $I\{220\}/I_0\{220\}$ of the intensities of X-ray diffraction were 0.5 and 3.3, respectively. The electric conductivity was 13.1% IACS. The tensile strength in the LD and the 0.2% yield strength were 854 MPa and 766 MPa, respectively. The stress relaxation rate was 5.8%. As the evaluation of the usual bending workability, the values of R/t in the LD and TD were 1.5 and 2.0, respectively. Cracks were observed on the surface and section of the bent portion after notching.

Comparative Example 12

A sheet material of a commercially-available typical Cu—Ti alloy (C199-EH, thickness: 0.15 mm) was prepared. Samples were cut out from the prepared sheet material of the copper alloy, to derive the mean crystal grain size of crystal grain structure, (maximum crystal grain size−minimum crystal grain size)/(mean crystal grain size), intensity of X-ray diffraction, electric conductivity, tensile strength, 0.2% yield strength, usual bending workability, bending workability after notching, and stress relaxation resistance thereof by the same methods as those in Examples 1-12.

As a result, the mean crystal grain size was 7 μm, and (maximum crystal grain size−minimum crystal grain size)/(mean crystal grain size) was 0.28. The ratios $I\{420\}/I_0\{420\}$ and $I\{220\}/I_0\{220\}$ of the intensities of X-ray diffraction were 0.3 and 3.9, respectively. The electric conductivity was 12.4% IACS. The tensile strength in the LD and the 0.2% yield strength were 962 MPa and 902 MPa, respectively. The stress relaxation rate was 6.2%. As the evaluation of the usual bending workability, the values of R/t in the LD and TD were 2.0 and 4.0, respectively. The sample was broken at the bent portion after notching.

The compositions and producing conditions in the examples and comparative examples are shown in Tables 1 and 2, respectively, and the results with respect to structures and characteristics therein are shown in Tables 3 and 4, respectively.

TABLE 1

| | Chemical Composition (wt %) | | | | | |
|---|---|---|---|---|---|---|
| | Cu | Ti | Fe | Co | Ni | others |
| Ex. 1 | bal. | 3.18 | — | — | — | — |
| Ex. 2 | bal. | 4.08 | — | — | — | — |
| Ex. 3 | bal. | 3.58 | — | — | — | — |
| Ex. 4 | bal. | 4.64 | — | — | — | — |
| Ex. 5 | bal. | 2.86 | — | 0.12 | 0.22 | — |
| Ex. 6 | bal. | 2.32 | 0.14 | — | — | Sn: 0.11, Zn: 0.36 |
| Ex. 7 | bal. | 1.93 | — | — | 0.54 | Sn: 0.08, Mg: 0.10, Zr: 0.11 |
| Ex. 8 | bal. | 1.55 | — | — | 0.12 | Cr: 0.21, B: 0.03 |
| Ex. 9 | bal. | 3.20 | — | — | — | Al: 0.14, P: 0.03 |
| Ex. 10 | bal. | 3.06 | — | — | — | V: 0.12, Mn: 0.06 |
| Ex. 11 | bal. | 3.14 | — | — | — | Ag: 0.12, Be: 0.06 |
| Ex. 12 | bal. | 3.35 | — | — | — | misch metal: 0.24 |
| Comp. 1 | bal. | 3.18 | — | — | — | — |
| Comp. 2 | bal. | 4.08 | — | — | — | — |
| Comp. 3 | bal. | 3.58 | — | — | — | — |
| Comp. 4 | bal. | 4.64 | — | — | — | — |
| Comp. 5 | bal. | 2.86 | — | 0.12 | 0.22 | — |
| Comp. 6 | bal. | 1.08 | — | — | — | Mg: 0.17, Zr: 0.20 |
| Comp. 7 | bal. | 5.22 | — | — | 0.15 | Zn: 0.15 |
| Comp. 8 | bal. | 3.18 | — | — | — | — |
| Comp. 9 | bal. | 3.18 | — | — | — | — |
| Comp. 10 | bal. | 3.18 | — | — | — | — |
| Comp. 11 | bal. | 3.22 | — | — | — | — |
| Comp. 12 | bal. | 3.16 | — | — | — | — |

TABLE 2

| | Manufacturing Conditions | | | | | | |
|---|---|---|---|---|---|---|---|
| | Hot-rolling Reduction (%) in temperatures ranging from less than 700° C. to 500° C. | Cold-rolling Reduction (%) | | Solution Treatment Conditions | | Ageing Conditions Hardness after ageing/Maximum Hardness after ageing | Finish Cold-rolling Reduction (%) |
| | | Before Solution Treatment | After Solution Treatment | Furnace Temperature (° C.) | Holding Time (sec) | | |
| Ex. 1 | 42 | 98 | 15 | 900 | 15 | 0.93 | 10 |
| Ex. 2 | 35 | 92 | 20 | 950 | 15 | 0.92 | 0 |
| Ex. 3 | 32 | 95 | 0 | 900 | 25 | 0.94 | 12 |
| Ex. 4 | 30 | 90 | 25 | 1000 | 15 | 0.93 | 0 |
| Ex. 5 | 50 | 90 | 15 | 850 | 20 | 0.94 | 15 |
| Ex. 6 | 57 | 96 | 45 | 850 | 15 | 0.95 | 0 |
| Ex. 7 | 50 | 98 | 20 | 830 | 15 | 0.95 | 25 |
| Ex. 8 | 55 | 96 | 20 | 850 | 8 | 0.94 | 30 |
| Ex. 9 | 45 | 96 | 15 | 900 | 18 | 0.94 | 15 |
| Ex. 10 | 40 | 95 | 0 | 900 | 20 | 0.94 | 25 |
| Ex. 11 | 40 | 86 | 0 | 900 | 25 | 0.94 | 10 |
| Ex. 12 | 40 | 92 | 0 | 900 | 20 | 0.94 | 15 |
| Comp. 1 | 20 | 98 | 15 | 800 | 150 | 0.93 | 10 |
| Comp. 2 | 25 | 92 | 20 | 950 | 15 | 0.92 | 0 |
| Comp. 3 | 0 | 95 | 0 | 850 | 120 | 0.94 | 12 |
| Comp. 4 | 0 | 90 | 25 | 950 | 15 | 0.93 | 0 |
| Comp. 5 | 15 | 90 | 15 | 850 | 15 | 1.00 | 15 |
| Comp. 6 | 45 | 96 | 50 | 750 | 20 | 0.95 | 20 |
| Comp. 7 | — | — | — | — | — | — | — |
| Comp. 8 | 42 | 98 | 15 | 900 | 600 | 0.93 | 10 |
| Comp. 9 | 42 | 98 | 15 | 700 | 600 | 0.93 | 10 |
| Comp. 10 | 42 | 98 | 15 | 900 | 15 | 0.93 | 55 |
| Comp. 11 | — | — | — | — | — | — | — |
| Comp. 12 | — | — | — | — | — | — | — |

TABLE 3

| | Structure | | |
|---|---|---|---|
| | Mean Crystal Grain Size (μm) | (Maximum Crystal Grain Size − Minimum Crystal Grain Size)/Mean Crystal Grain Size | Ratio of Intensities of X-ray Diffraction |
| | | | I{420}/Io{420}   I{220}/Io{220} |
| Ex. 1 | 8 | 0.06 | 1.3   2.8 |
| Ex. 2 | 12 | 0.08 | 1.6   2.6 |
| Ex. 3 | 16 | 0.09 | 1.5   2.7 |
| Ex. 4 | 6 | 0.12 | 2.0   2.6 |
| Ex. 5 | 18 | 0.08 | 1.4   3.2 |
| Ex. 6 | 15 | 0.05 | 2.0   2.6 |
| Ex. 7 | 10 | 0.07 | 1.5   2.8 |
| Ex. 8 | 14 | 0.10 | 1.4   2.6 |
| Ex. 9 | 11 | 0.14 | 1.2   3.2 |
| Ex. 10 | 12 | 0.11 | 1.1   3.6 |

TABLE 3-continued

| | Structure | | | |
|---|---|---|---|---|
| | Mean Crystal Grain Size (μm) | (Maximum Crystal Grain Size − Minimum Crystal Grain Size)/Mean Crystal Grain Size | Ratio of Intensities of X-ray Diffraction | |
| | | | I{420}/Io{420} | I{220}/Io{220} |
| Ex. 11 | 16 | 0.09 | 1.6 | 2.5 |
| Ex. 12 | 12 | 0.06 | 1.4 | 2.7 |
| Comp. 1 | 5 | 0.42 | 0.6 | 4.4 |
| Comp. 2 | 12 | 0.36 | 0.4 | 3.2 |
| Comp. 3 | 18 | 0.35 | 0.3 | 4.1 |
| Comp. 4 | 5 | 0.33 | 0.7 | 3.8 |
| Comp. 5 | 3 | 0.28 | 0.3 | 4.3 |
| Comp. 6 | 8 | 0.35 | 0.3 | 4.3 |
| Comp. 7 | — | — | — | — |
| Comp. 8 | 62 | 0.06 | 1.8 | 2.4 |
| Comp. 9 | 3 | 0.48 | 0.2 | 6.1 |
| Comp. 10 | 8 | 0.06 | 0.2 | 5.6 |
| Comp. 11 | 7 | 0.25 | 0.5 | 3.3 |
| Comp. 12 | 7 | 0.28 | 0.3 | 3.9 |

TABLE 4

| | Characteristics | | | | | | |
|---|---|---|---|---|---|---|---|
| | Electric Conductivity | Tensile Strength (LD) | 0.2% Yield Strength | Minimum Bending Radius in Usual Bending Workability (R/t) | | Bending Workability(LD) after Notching | Stress Relaxation Rate |
| | (% IACS) | (MPa) | (MPa) | LD | TD | (Evaluation) | (TD) (%) |
| Ex. 1 | 13.2 | 1005 | 935 | 0.0 | 0.5 | good | 2.4 |
| Ex. 2 | 12.2 | 1016 | 915 | 0.0 | 0.0 | good | 2.2 |
| Ex. 3 | 12.4 | 976 | 905 | 0.0 | 0.0 | good | 2.8 |
| Ex. 4 | 13.0 | 1025 | 946 | 0.0 | 0.5 | good | 3.1 |
| Ex. 5 | 13.6 | 980 | 912 | 0.0 | 0.3 | good | 2.2 |
| Ex. 6 | 14.5 | 986 | 888 | 0.0 | 0.0 | good | 3.4 |
| Ex. 7 | 15.1 | 968 | 892 | 0.0 | 0.0 | good | 3.3 |
| Ex. 8 | 16.2 | 976 | 965 | 0.0 | 0.0 | good | 3.4 |
| Ex. 9 | 12.4 | 1025 | 955 | 0.0 | 0.7 | good | 3.6 |
| Ex. 10 | 12.6 | 1036 | 970 | 0.0 | 0.8 | good | 3.3 |
| Ex. 11 | 13.1 | 1025 | 955 | 0.0 | 0.5 | good | 2.2 |
| Ex. 12 | 12.8 | 1034 | 967 | 0.0 | 0.7 | good | 2.3 |
| Comp. 1 | 13.3 | 1001 | 928 | 2.0 | 3.0 | broken | 4.2 |
| Comp. 2 | 12.6 | 996 | 906 | 1.0 | 2.5 | broken | 3.9 |
| Comp. 3 | 12.7 | 963 | 898 | 1.5 | 2.5 | bad | 4.2 |
| Comp. 4 | 13.1 | 1011 | 952 | 2.0 | 3.5 | bad | 5.4 |
| Comp. 5 | 14.1 | 986 | 908 | 2.0 | 5.0 | broken | 7.6 |
| Comp. 6 | 22.5 | 842 | 768 | 1.0 | 2.5 | bad | 6.4 |
| Comp. 7 | — | — | — | — | — | — | — |
| Comp. 8 | 12.7 | 928 | 856 | 2.0 | 2.5 | bad | 2.0 |
| Comp. 9 | 15.6 | 1026 | 945 | 3.0 | broken | broken | 11.6 |
| Comp. 10 | 12.4 | 1114 | 1056 | broken | broken | broken | 6.4 |
| Comp. 11 | 13.1 | 854 | 766 | 1.5 | 2.0 | bad | 5.8 |
| Comp. 12 | 12.4 | 962 | 902 | 2.0 | 4.0 | broken | 6.2 |

Furthermore, when the sheet material of the copper alloy was broken even if R/t was 5.0, evaluation was not further carried out, and "broken" was described in the column of evaluation of the usual bending workability of the sheet material of the copper alloy in Table 4. In the column of evaluation of the bending workability after notching of the sheet material of the copper alloy in Table 4, "good" was described when cracks were not observed on the surface and section of the bent portion after notching, "bad" was described when cracks were observed thereon, and "broken" was described when the sheet material was broken at the bent portion thereof. The worst results of the three test pieces were adopted to be evaluated as "good", "bad" and "broken", and it was judged that the evaluation of "good" was acceptable.

FIGS. 5A through 5D are optical microphotographs showing the structure of the surface of the sheet material of the copper alloy before the solution treatment, after the solution treatment at 850° C. for 10 seconds, after the solution treatment at 850° C. for 30 seconds, and after the solution treatment at 850° C. for 60 seconds, respectively, in Example 1. FIGS. 6A through 6D are optical microphotographs showing the structure of the surface of the sheet material of the copper alloy before the solution treatment, after the solution treatment at 850° C. for 10 seconds, after the solution treatment at 850° C. for 30 seconds, and after the solution treatment at 850° C. for 60 seconds, respectively, in Comparative Example 1 wherein the copper alloy having the same composition as that in Example 1 was used and the same treatments as those in Example 1 were carried out, except that the hot-rolling reduction in the temperature range of less than 700° C. to 500° C. was 20%, which was lower than that in Example 1, and that a plurality of cold rolling operations before and after the process annealing (intermediate solution treatment) at 850° C. for 120 seconds were carried out during the cold rolling before the solution treatment. As shown in FIGS. 5A through 5D, in Example 1, crystal boundary after rolling was not clearly observed due to strong rolling before the solution treatment, so that a uniform recrystallized grain structure was obtained while the mean crystal grain size varies due to the variation of holding time in the solution treatment. On the other hand, in Comparative Example 1, since the plurality of cold rolling operations before and after the process annealing (intermediate solution treatment) at 850° C. for 120 seconds were carried out during the cold rolling before the solution treatment, the rolling reduction in cold rolling immediately before the solution treatment was low, and there was a time lag in the formation and growth of recrystallized grains every rolled crystal grain during the solution treatment, so that the uniform recrystallized grain structure was not obtained even if the holding time was adjusted.

As can be seen from Tables 3 and 4, in all of the sheet materials of copper alloys in Examples 1-12, the mean crystal grain size is in the range of from 5 μm to 25 μm, and (maximum crystal grain size−minimum crystal grain size)/(mean crystal grain size) is not greater than 0.20. The sheet materials of copper alloys satisfy $I\{420\}/I_0\{420\}>1.0$ and $I\{220\}/I_0\{220\}\leq 4.0$, and have a 0.2% yield strength of not less than 850 MPa. The sheet materials of copper alloys also have such an excellent bending workability that the values R/t in both of the LD and TD are not greater than 1.0. With respect to the bending workability after notching in the LD, which is practically important, cracks were not produced in spite of severe bending of R/t=0 in the 90° W bending test. Moreover, the sheet materials of copper alloys have such an excellent stress relaxation resistance that the stress relaxation rate in the TD, which is important when the sheet materials of copper alloys are used as the materials of connectors for automobiles and so forth, is not greater than 5%.

On the other hand, in all of sheet materials of copper alloys in Comparative Examples 1-5, although copper alloys having the same compositions as those in Examples 1-5 were used, respectively, (maximum crystal grain size−minimum crystal grain size)/(mean crystal grain size) was a high value which was not less than 0.28. In addition, the intensity of X-ray diffraction on the {420} crystal plane was weak, and the intensity of X-ray diffraction on the {220} crystal plane was high, so that there were trade-off relationships between the strength and bending workability of the sheet materials of copper alloys and between the bending workability and stress relaxation resistance of the sheet materials of copper alloys, respectively. In particular, it was impossible to carry out the bending after notching.

In Comparative Example 6, the content of Ti in the used copper alloy was too low, so that the amount of generated deposits was small. For that reason, the strength level was low in spite of the ageing treatment which was carried out on the necessary conditions for obtaining the maximum hardness. In addition, the crystal orientation having a principal orientation component of {420} was weak in spite of the high cold-rolling reduction of not less than 95% before the solution treatment. Moreover, the bending workability after notching was not improved in spite of the low strength level. In Comparative Example 7, since the content of Ti was too high to set appropriate solution treatment conditions, cracks were produced during the production of the sheet material, so that it was not possible to produce any sheet material to be evaluated.

In Comparative Example 8, since the solution treatment time was too long, crystal grains were coarsened, so that it was not possible to obtain a good bending workability. In Comparative Example 9, since the solution treatment temperature was 700° C. which was too low, recrystallization did not sufficiently proceed, so that a mixed grain structure was produced for deteriorating all of the tensile strength, bending workability and stress relaxation resistance of the sheet material.

In Comparative Example 10, since the finish rolling reduction was too high, the crystal orientation having a principal orientation component of {420} was weak, and the crystal orientation having a principal orientation component of {220} was too strong, so that the bending workability of the sheet material of the copper alloy in the bad way was remarkably bad although the strength thereof was high.

In Comparative Examples 11 and 12, (maximum crystal grain size−minimum crystal grain size)/(mean crystal grain size) was high. In addition, the intensity of X-ray diffraction on the {420} crystal plane was weak, and the intensity of X-ray diffraction on the {220} crystal plane was high, so that all of the strength, bending workability and stress relaxation resistance of the sheet materials of copper alloys were inferior to those of the sheet material of the copper alloy in Example 1, which has substantially the same composition as that of the sheet materials of copper alloys in Comparative Examples 11 and 12.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method for producing a sheet material of a copper alloy having a 0.2% yield strength of 850 MPa or more, the method comprising the steps of:

melting and casting raw materials of a copper alloy to form an ingot, said copper alloy having a chemical composition which consists of 1.2 to 5.0 wt % of titanium and the balance being copper and unavoidable impurities;

hot-rolling the ingot in a temperature range of from 950° C. to 500° C. to form a plate of the copper alloy, the hot-rolling of the ingot being carried out at a rolling reduction of not less than 30% in a temperature range of from less than 700° C. to 500° C. after carrying out an initial rolling pass in a temperature range of from 950° C. to 700° C.;

cold-rolling the plate of the copper alloy at a rolling reduction of not less than 85%;

carrying out a solution treatment for holding the plate of the copper alloy at a higher temperature than a solid solubility curve of the copper alloy by 30° C. or more, in a temperature range of from 750° C. to 1000° C. for 5 seconds to 5 minutes;

cold-rolling the plate of the copper alloy at a rolling reduction of 0 to 50% after the solution treatment;

ageing the plate of the copper alloy, which is cold-rolled after the solution treatment, at a temperature TM ±10° C. in a temperature range of from of 300 to 550° C. to obtain an aged plate of the copper alloy having a hardness of 0.90 to 0.95 $H_M$ assuming that the ageing temperature capable of obtaining the maximum hardness in a chemical composition of said copper alloy is TM (° C.) and that the maximum is $H_M$ (HV); and finish cold-rolling the aged plate of the copper alloy at a rolling reduction of 0 to [30%, wherein the sheet material of the copper alloy has a mean crystal grain size of 5 to 25 μm, and (maximum crystal grain size−minimum crystal grain size)/(mean crystal grain size) is not greater than 0.20, assuming that the maximum value of mean values, each of which is the mean value of crystal grain sizes in a corresponding one of a plurality of regions which are selected from a surface of the sheet material of the copper alloy at random and which have the same shape and size, is the maximum crystal grain size, that the minimum value of the mean values is the minimum crystal grain size and that the mean value of the mean values is the mean crystal grain size, and wherein the sheet material of the copper alloy has a crystal orientation which satisfies $I\{420\}/I_0\{420\}>1.0$, assuming that the intensity of X-ray diffraction on the $\{420\}$ crystal plane on the surface of the sheet material of the copper alloy is $I\{420\}$ and that the intensity of X-ray diffraction on the $\{420\}$ crystal plane of the standard powder of pure copper is $I_0\{420\}$.

2. A method for producing a sheet material of a copper alloy as set forth in claim 1, wherein said ingot is hot-rolled at a rolling reduction of not less than 60% in the temperature range of from 950° C. to 700° C.

3. A method for producing a sheet material of a copper alloy as set forth in claim 1, wherein said rolling reduction in cold-rolling between said hot-rolling and said solution treatment is not less than 90%.

4. A method for producing a sheet material of a copper alloy as set forth in claim 1, wherein said solution treatment is carried out by holding said plate of the copper alloy for a holding period of time which is adjusted so that the mean crystal grain size of the plate of the copper alloy after the solution treatment is in the range of from 5 μm to 25 μm.

5. A method for producing a sheet material of a copper alloy as set forth in claim 1, wherein a low temperature annealing operation is carried out at a temperature of 150 to 450° C. after the finish cold rolling.

6. A method for producing a sheet material of a copper alloy having a 0.2% yield strength of 850 MPa or more, the method comprising the steps of:

melting and casting raw materials of a copper alloy to form an ingot, said copper alloy having a chemical composition which consists of 1.2 to 5.0 wt % of titanium, one or more elements which are selected from the group consisting of 1.5 wt % or less of nickel, 1.0 wt % or less of cobalt and 0.5 wt % or less of iron, and the balance being copper and unavoidable impurities;

hot-rolling the ingot in a temperature range of from 950° C. to 500° C. to form a plate of the copper alloy, the hot-rolling of the ingot being carried out at a rolling reduction of not less than 30% in a temperature range of from less than 700° C. to 500° C. after carrying out an initial rolling pass in a temperature range of from 950° C. to 700° C.;

cold-rolling the plate of the copper alloy at a rolling reduction of not less than 85%;

carrying out a solution treatment for holding the plate of the copper alloy at a higher temperature than a solid solubility curve of the copper alloy by 30° C. or more, in a temperature range of from 750° C. to 1000° C. for 5 seconds to 5 minutes;

cold-rolling the plate of the copper alloy at a rolling reduction of 0 to 50% after the solution treatment;

ageing the plate of the copper alloy, which is cold-rolled after the solution treatment, at a temperature TM ±10° C. in a temperature range of from 300 to 550° C. to obtain an aged plate of the copper alloy having a hardness of 0.90 to 0.95 $H_M$ assuming that the ageing temperature capable of obtaining the maximum hardness in a chemical composition of said copper alloy is TM (° C.) and that the maximum is $H_M$ (HV); and finish cold-rolling the aged plate of the copper alloy at a rolling reduction of 0 to 30%, wherein the sheet material of the copper alloy has a mean crystal grain size of 5 to 25 μm, and (maximum crystal grain size−minimum crystal grain size)/(mean crystal grain size) is not greater than 0.20, assuming that the maximum value of mean values, each of which is the mean value of crystal grain sizes in a corresponding one of a plurality of regions which are selected from a surface of the sheet material of the copper alloy at random and which have the same shape and size, is the maximum crystal grain size, that the minimum value of the mean values is the minimum crystal grain size and that the mean value of the mean values is the mean crystal grain size, and wherein the sheet material of the copper alloy has a crystal orientation which satisfies $I\{420\}/I_0\{420\}>1.0$, assuming that the intensity of X-ray diffraction on the $\{420\}$ crystal plane on the surface of the sheet material of the copper alloy is $I\{420\}$ and that the intensity of X-ray diffraction on the $\{420\}$ crystal plane of the standard powder of pure copper is $I_0\{420\}$.

7. A method for producing a sheet material of a copper alloy having a 0.2% yield strength of 850 MPa or more, the method comprising the steps of:

melting and casting raw materials of a copper alloy to form an ingot, said copper alloy having a chemical composition which consists of: 1.2 to 5.0 wt % of titanium; one or more elements which are selected from the group consisting of 1.2 wt % or less of tin, 2.0 wt % or less of zinc, 1.0 wt % or less of magnesium, 1.0 wt % or less of zirconium, 1.0 wt % or less of aluminum, 1.0 wt % or less of silicon, 0.1 wt % or less of phosphorus, 0.05 wt % or less of boron, 1.0 wt % or less of chromium, 1.0 wt % or less of manganese, 1.0 wt % or less of vanadium, 1.0 wt % or less of silver, 1.0 wt % or less of beryllium and 1.0 wt % or less of misch metal, the total amount of these elements being 3 wt % or less; and the balance being copper and unavoidable impurities;

hot-rolling the ingot in a temperature range of from 950° C. to 500° C. to form a plate of the copper alloy, the hot-rolling of the ingot being carried out at a rolling reduction of not less than 30% in a temperature range of from less than 700° C. to 500° C. after carrying out an initial rolling pass in a temperature range of from 950° C. to 700° C.;

cold-rolling the plate of the copper alloy at a rolling reduction of not less than 85%;

carrying out a solution treatment for holding the plate of the copper alloy at a higher temperature than a solid solubility curve of the copper alloy by 30° C. or more, in a temperature range of from 750° C. to 1000° C. for 5 seconds to 5 minutes;

cold-rolling the plate of the copper alloy at a rolling reduction of 0 to 50% after the solution treatment;

ageing the plate of the copper alloy, which is cold-rolled after the solution treatment, at a temperature TM ±10° C. in a temperature range of from 300 to 550° C. to obtain an aged plate of the copper alloy having a hardness of 0.90 to 0.95 $H_M$ assuming that the ageing temperature capable of obtaining the maximum hardness in a chemical composition of said copper alloy is TM (° C.) and that the maximum is $H_M$ (HV); and finish cold-rolling the aged plate of the copper alloy at a rolling reduction of 0 to 30 at a rolling reduction of 0 to 30%, wherein the sheet material of the copper alloy has a mean crystal grain size of 5 to 25 μm, and (maximum crystal grain size−minimum crystal grain size)/(mean crystal grain size) is not greater than 0.20, assuming that the maximum value of mean values, each of which is the mean value of crystal grain sizes in a corresponding one of a plurality of regions which are selected from a surface of the sheet material of the copper alloy at random and which have the same shape and size, is the maximum crystal grain size, that the minimum value of the mean values is the minimum crystal grain size and that the mean value of the mean values is the mean crystal grain size, and wherein the sheet material of the copper alloy has a crystal orientation which satisfies $I\{420\}/I_0\{420\}>1.0$, assuming that the intensity of X-ray diffraction on the $\{420\}$ crystal plane on the surface of the sheet material of the copper alloy is $I\{420\}$ and that the intensity of X-ray diffraction on the $\{420\}$ crystal plane of the standard powder of pure copper is $I_0\{420\}$.

8. A method for producing a sheet material of a copper alloy having a 0.2% yield strength of 850 MPa or more, the method comprising the steps of:

melting and casting raw materials of a copper alloy to form an ingot, said copper alloy having a chemical composition which consists of: 1.2 to 5.0 wt % of titanium; one or more elements which are selected from the group consisting of 1.5 wt % or less of nickel, 1.0 wt % or less of cobalt and 0.5 wt % or less of iron; one or more elements which are selected from the group consisting of 1.2 wt % or less of tin, 2.0 wt % or less of zinc, 1.0 wt % or less of magnesium, 1.0 wt % or less of zirconium, 1.0 wt % or less of aluminum, 0.1 wt % or less of phosphorus, 0.05 wt % or less of boron, 1.0 wt % or less of chromium, 1.0 wt % or less of manganese, 1.0 wt % or less of vanadium, 1.0 wt % or less of silver, 1.0 wt % or less of beryllium and 1.0 wt % or less of misch metal, the total amount of these elements being 3 wt % or less; and the balance being copper and unavoidable impurities;

hot-rolling the ingot in a temperature range of from 950° C. to 500° C. to form a plate of the copper alloy, the hot-rolling of the ingot being carried out at a rolling reduction of not less than 30% in a temperature range of from less than 700° C. to 500° C. after carrying out an initial rolling pass in a temperature range of from 950° C. to 700° C.;

cold-rolling the plate of the copper alloy at a rolling reduction of not less than 85%;

carrying out a solution treatment for holding the plate of the copper alloy at a higher temperature than a solid solubility curve of the copper alloy by 30° C. or more, in a temperature range of from 750° C. to 1000° C. for 5 seconds to 5 minutes;

cold-rolling the plate of the copper alloy at a rolling reduction of 0 to 50% after the solution treatment;

ageing the plate of the copper alloy, which is cold-rolled after the solution treatment, at a temperature TM ±10° C. in a temperature range of from 300 to 550° C. to obtain an aged plate of the copper alloy having a hardness of 0.90 to 0.95 $H_M$ assuming that the ageing temperature capable of obtaining the maximum hardness in a chemical composition of said copper alloy is TM (° C.) and that the maximum is $H_M$ (HV); and finish cold-rolling the aged plate of the copper alloy at a rolling reduction of 0 to 30%%, wherein the sheet material of the copper alloy has a mean crystal grain size of 5 to 25 μm, and (maximum crystal grain size−minimum crystal grain size)/(mean crystal grain size) is not greater than 0.20, assuming that the maximum value of mean values, each of which is the mean value of crystal grain sizes in a corresponding one of a plurality of regions which are selected from a surface of the sheet material of the copper alloy at random and which have the same shape and size, is the maximum crystal grain size, that the minimum value of the mean values is the minimum crystal grain size and that the mean value of the mean values is the mean crystal grain size, and wherein the sheet material of the copper alloy has a crystal orientation which satisfies $I\{420\}/I_0\{420\}>1.0$, assuming that the intensity of X-ray diffraction on the $\{420\}$ crystal plane on the surface of the sheet material of the copper alloy is $I\{420\}$ and that the intensity of X-ray diffraction on the $\{420\}$ crystal plane of the standard powder of pure copper is $I_0\{420\}$.

9. A method for producing a sheet material of a copper alloy as set forth in any one of claims 6 thorough 8, wherein said ingot is hot-rolled at a rolling reduction of not less than 60% in the temperature range of from 950° C. to 700° C.

10. A method for producing a sheet material of a copper alloy as set forth in any one of claims 6 through 8, wherein said rolling reduction in cold-rolling between said hot-rolling and said solution treatment is not less than 90%.

11. A method for producing a sheet material of a copper alloy as set forth in any one of claims 6 through 8, wherein said solution treatment is carried out by holding said plate of the copper alloy for a holding period of time which is adjusted so that the mean crystal grain size of the plate of the copper alloy after the solution treatment is in the range of from 5 μm to 25 μm.

12. A method for producing a sheet material of a copper alloy as set forth in any one of claims 6 through 8, wherein a low temperature annealing operation is carried out at a temperature of 150 to 450° C. after the finish cold rolling.

\* \* \* \* \*